(12) United States Patent
Davis et al.

(10) Patent No.: US 9,146,358 B2
(45) Date of Patent: Sep. 29, 2015

(54) COLLIMATOR HOLDER FOR ELECTRO-OPTICAL SENSOR

(71) Applicant: Gridview Optical Solutions, LLC., Plano, TX (US)

(72) Inventors: Philip B. Davis, Richardson, TX (US); Ye Li, Plano, TX (US)

(73) Assignee: GRIDVIEW OPTICAL SOLUTIONS, LLC, Plano, TX (US)

( * ) Notice: Subject to any disclaimer, the term of this patent is extended or adjusted under 35 U.S.C. 154(b) by 126 days.

(21) Appl. No.: 13/943,240

(22) Filed: Jul. 16, 2013

(65) Prior Publication Data

US 2015/0023629 A1    Jan. 22, 2015

(51) Int. Cl.
| | |
|---|---|
| *G02B 6/32* | (2006.01) |
| *G02B 6/34* | (2006.01) |
| *G02B 6/27* | (2006.01) |
| *G01R 15/24* | (2006.01) |

(52) U.S. Cl.
CPC .............. *G02B 6/2706* (2013.01); *G02B 6/322* (2013.01); *G02B 6/325* (2013.01); *G02B 6/34* (2013.01); *G01R 15/247* (2013.01)

(58) Field of Classification Search
None
See application file for complete search history.

(56) References Cited

U.S. PATENT DOCUMENTS

| | | |
|---|---|---|
| 2,295,959 A | 9/1942 | Melville |
| 2,709,800 A | 5/1955 | Temple et al. |
| 3,324,393 A | 6/1967 | Edward et al. |
| 3,386,032 A | 5/1968 | Medlar |
| 4,216,503 A | 8/1980 | Wiggins |
| 4,564,754 A | 1/1986 | Sato et al. |
| 4,590,505 A | 5/1986 | Bluzer |
| 4,635,055 A | 1/1987 | Fernandes et al. |
| 4,683,421 A | 7/1987 | Miller et al. |
| 4,755,665 A | 7/1988 | Ulmer et al. |
| 4,758,962 A | 7/1988 | Fernandes et al. |

(Continued)

FOREIGN PATENT DOCUMENTS

| | | |
|---|---|---|
| CN | 101430347 A | 5/2009 |
| EP | 0736772 A2 | 10/1996 |

(Continued)

OTHER PUBLICATIONS

Siobodan Petricevic, Slatan Stojkovic and Jovan B. Radunovic; Title: Practical Application of Fiber-Optic Current Sensor inPower System Harmonic Measurement, vol. 55, No. 3, Jun. 2006 www.fieldmetrics.net.

(Continued)

*Primary Examiner* — Jerry Rahll
(74) *Attorney, Agent, or Firm* — Steptoe & Johnson LLP

(57) ABSTRACT

A collimator holder in the form of a glass or ceramic block that has precisely machined holes formed in the block to receive respective collimator assemblies. Each collimator assembly includes an optical fiber attached to a GRIN lens by a ferrule. Optionally, each collimator assembly can include a glass tube that surrounds at least the lens and optionally part or all of the ferrule. The lens or the tube is inserted into the hole and bonded therein by an epoxy. The block, together with the collimator assemblies installed, is bonded to the bottom surface of a crystal assembly thereby forming an electro-optic sensor. The crystal assembly can include one or more polarizing beam splitters, an electro-optic crystal, and a prism, configured to sense a current through a current-carrying cable or a voltage between the cable and another potential.

18 Claims, 14 Drawing Sheets

(56) References Cited

U.S. PATENT DOCUMENTS

| | | | |
|---|---|---|---|
| 4,797,607 | A | 1/1989 | Dupraz |
| 4,799,005 | A | 1/1989 | Fernandes et al. |
| 4,829,298 | A | 5/1989 | Fernandes |
| 4,869,254 | A | 9/1989 | Stone |
| 4,894,608 | A | 1/1990 | Ulmer |
| 4,947,107 | A | 8/1990 | Doerfler et al. |
| 4,962,990 | A | 10/1990 | Matsuzawa et al. |
| 4,999,571 | A | 3/1991 | Ishiko et al. |
| 5,029,101 | A | 7/1991 | Fernandes et al. |
| 5,114,228 | A | 5/1992 | Greenfield et al. |
| 5,130,642 | A | 7/1992 | Hoffman et al. |
| 5,311,138 | A | 5/1994 | Ott et al. |
| 5,382,901 | A | 1/1995 | Okajima et al. |
| 5,486,754 | A | 1/1996 | Cruden et al. |
| 5,731,579 | A | 3/1998 | Woods |
| 5,732,167 | A | 3/1998 | Ishiko et al. |
| 5,878,176 | A * | 3/1999 | Cheng ............................ 385/11 |
| 5,892,357 | A | 4/1999 | Woods et al. |
| 5,939,711 | A | 8/1999 | Crawford et al. |
| 5,952,819 | A | 9/1999 | Berkcan et al. |
| 5,963,026 | A | 10/1999 | Bosselmann et al. |
| 6,072,366 | A | 6/2000 | Maeda et al. |
| 6,124,706 | A | 9/2000 | Woods et al. |
| 6,166,816 | A | 12/2000 | Blake |
| 6,297,625 | B1 | 10/2001 | Bosselmann et al. |
| 6,307,666 | B1 | 10/2001 | Davidson et al. |
| 6,362,615 | B1 | 3/2002 | Davidson et al. |
| 6,388,434 | B1 | 5/2002 | Davidson et al. |
| 6,462,327 | B1 | 10/2002 | Ezell |
| 6,512,357 | B2 | 1/2003 | Bosselmann et al. |
| 6,580,553 | B2 | 6/2003 | Kim et al. |
| 6,630,819 | B2 | 10/2003 | Lanagan et al. |
| 6,753,913 | B1 | 6/2004 | Bilhan |
| 6,844,799 | B2 | 1/2005 | Attarian et al. |
| 7,068,025 | B2 | 6/2006 | Bjorn |
| 7,129,693 | B2 | 10/2006 | Yakymyshyn et al. |
| 7,164,263 | B2 | 1/2007 | Yakymyshyn et al. |
| 7,199,571 | B2 | 4/2007 | Johnson et al. |
| 7,646,192 | B2 | 1/2010 | Bjorn |
| 7,683,795 | B2 | 3/2010 | Bjorn |
| 7,777,605 | B2 | 8/2010 | Zumoto et al. |
| 7,786,719 | B2 | 8/2010 | Kurosawa et al. |
| 7,837,807 | B2 | 11/2010 | Yoshizawa |
| 2004/0223678 | A1 * | 11/2004 | He et al. ......................... 385/11 |
| 2006/0170410 | A1 | 8/2006 | Bjorn |
| 2007/0205750 | A1 | 9/2007 | Yakymyshyn et al. |
| 2011/0052115 | A1 | 3/2011 | Lee |

FOREIGN PATENT DOCUMENTS

| | | |
|---|---|---|
| JP | 61-070468 | 4/1986 |
| JP | 04-194668 | 7/1992 |
| JP | 05-72233 | 3/1993 |
| JP | 7333258 A | 12/1995 |
| JP | 08-5462 | 1/1996 |
| JP | 2000-21664 | 1/2000 |
| JP | 2007-104832 | 4/2007 |
| JP | 2007-285765 | 11/2007 |
| WO | WO 2011/053657 A1 | 5/2011 |

OTHER PUBLICATIONS

Siobodan Petricevic, Slatan Stojkovic and Jovan B. Radunovic; Title: Development of a Portable Fiber-Optic Current Sensor for Power Systems Monitoring; Publication: IEEE Transactions on Instrumentation and Measurement, vol. 53 No. I, Feb. 2004.

PCT/US2010/054333 International Search Report and Written Opinion dated Dec. 30, 2010.

PCT/US2013/021733 International Search Report and Written Opinion dated Apr. 18, 2013.

Shuping Wang, Avinash Karri, Yossi Harlev; Use of dual-frequency excitation method to improve the accuracy of an optical current sensor; Published about Aug. 21, 2009, Library of Congress.

Dr Chris Yakymyshyn, Assoc. Prof. Department Electr. and Computer Engineering, Montana State University, Bozeman Montana; Tutorial on Optical Current Sensor Systems, Proceedings 3rd EPRI Optical Sensor Systems Workshop, Feb. 2002.

Guenter B. Finke, Gapped Magnetic Core Structures, Magnetic Metals Corporation, Camden, New Jersey 08101. Obtained from Internet, searching for Finke, Gapped Magnetic Core Structure.

IEC International Standard 60044-8 Ed. First edition, Jul. 2002, Title page, Instrument transformers, Part 8: Electronic current transformers and pp. 118-122, describing Requirements on ECTs, [Electronic Current Transformers], and eVTs, [Electronic Voltage Transformers], involving digital data transmission or processing.

\* cited by examiner

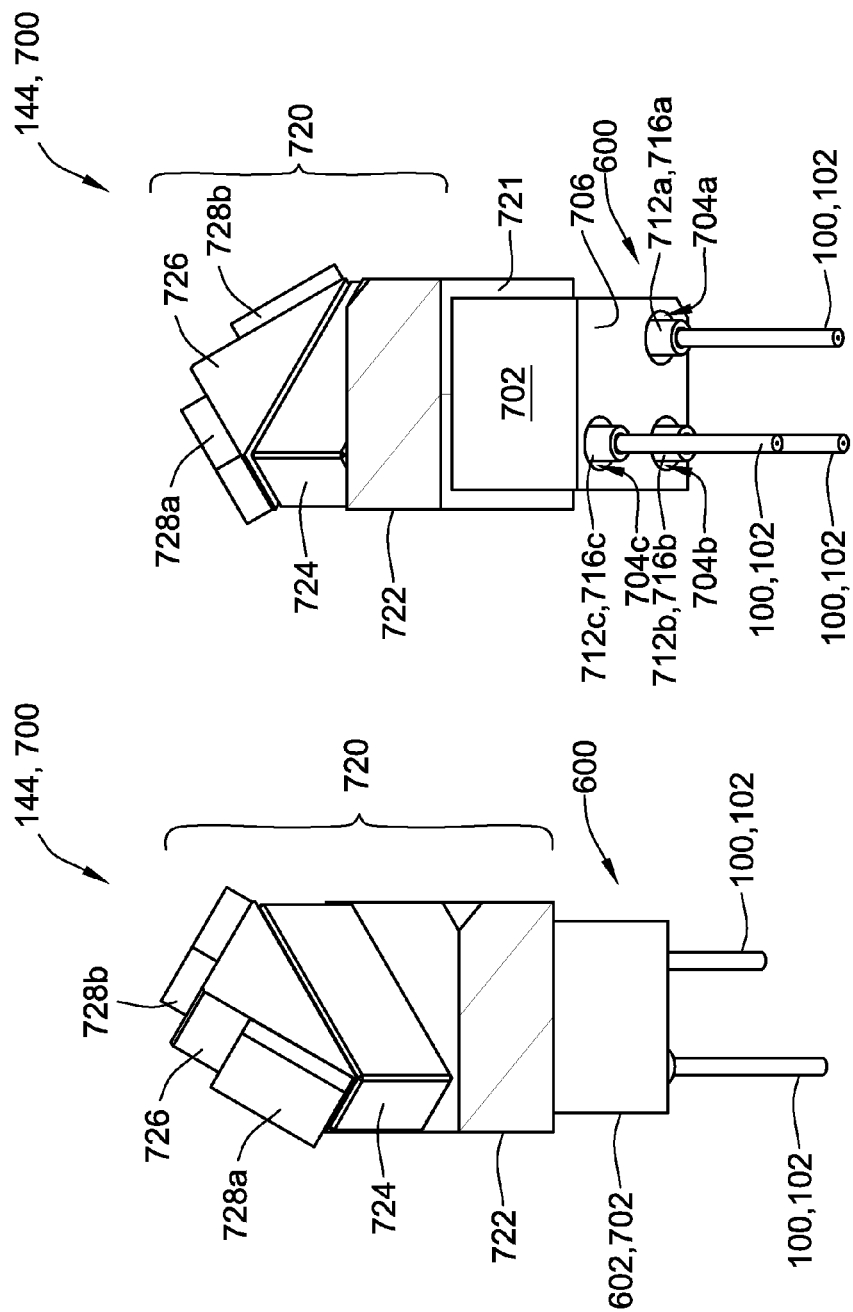

COLLIMATOR HOLDER FOR ELECTRO-OPTICAL SENSOR

FIELD OF THE PRESENT DISCLOSURE

Aspects of the present disclosure relate to optical sensors, and more particularly, to a collimator holder for an optical sensor configured to sense a current in a current carrying cable or a voltage potential between a current carrying cable and another potential.

BACKGROUND

An electro-optical sensor is composed of multiple pieces, such as one or more polarizing beam splitters, an electro-optical crystal, prisms, a collimator assembly, and so forth. Light produced by a light source, such as a light emitting diode, is carried by one or more optical fibers, which are conventionally connected by corresponding ferrules to a gradient-index (GRIN) lens, and this collimator assembly is then bonded to, for example, the polarizing beam splitter (PBS) where the incoming light from the light source is polarized in a linear direction. It is important that the collimator assembly be aligned very precisely relative to the surface of the PBS to which it is bonded because the components of the electro-optical sensor (e.g., the ferrule and the GRIN lens) are sensitive to temperature, and thus will move according to their respective thermal expansion coefficients. These movements can occur at dissimilar rates, causing the fiber optic assembly to become slightly out of alignment or to bend as the electro-optical sensor is exposed to a range of temperatures. In the case of a voltage electro-optical sensor, for example, these movements can create undesired effects on the incoming light that are difficult to distinguish from the applied electric field (e-field) of interest. In other words, the light can be affected in such a way as to create a "phantom" applied voltage that can distort accurate measurements of the voltage between a current carrying cable and another potential, such as ground, thereby reducing the accuracy of the electro-optical sensor over its operational lifetime. A similar undesired Moreover, when bonding or adhering the GRIN lens to the PBS, there is a relatively small surface area between the bonding surfaces, which is constrained by the cross-sectional area of the GRIN lens. Thus, the GRIN lens must be very accurately bonded to the PBS, such as at precisely orthogonal, with very tight tolerances for error to ensure a high accuracy of current or voltage sensing by the electro-optical sensor. Moreover, the bonding strength of the interface between the GRIN lens and the PBS is constrained by the surface area available on the end of the exposed GRIN lens. Eliminating these two constraints will improve the overall accuracy of the electro-optical sensor, particularly over its operational lifetime.

The alignment problems are multiplied as the number of collimator assemblies increase. For two collimator assemblies, each must be attached to the corresponding input and output polarizing beam splitters in a very precise manner, so that both are as parallel to one another as tolerances allow. Thus, not only must each collimator assembly be bonded to the PBS at precisely an orthogonal angle, all collimator assemblies must be precisely parallel to one another as well along the length of the GRIN lens and ferrule, for maximum accuracy. After each collimator assembly is bonded, precise measurements need to be made to accurately align the next collimator assembly to the PBS and relative to the other already bonded collimator assemblies. This process is tedious and prone to producing mismatches from one electro-optical sensor to another.

What is needed is a collimator holder for an electro-optical sensor that overcomes these and other problems.

BRIEF SUMMARY

According to an aspect of the present disclosure, [TO BE COMPLETED FOLLOWING INVENTOR REVIEW OF THE CLAIMS]

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

FIG. 7 is a top perspective view of an electro-optical voltage sensor having a crystal assembly bonded to a collimator holder such as the one shown in FIG. 6.

FIG. 8 is a bottom perspective view of the sensor shown in FIG. 7.

Figure 1:
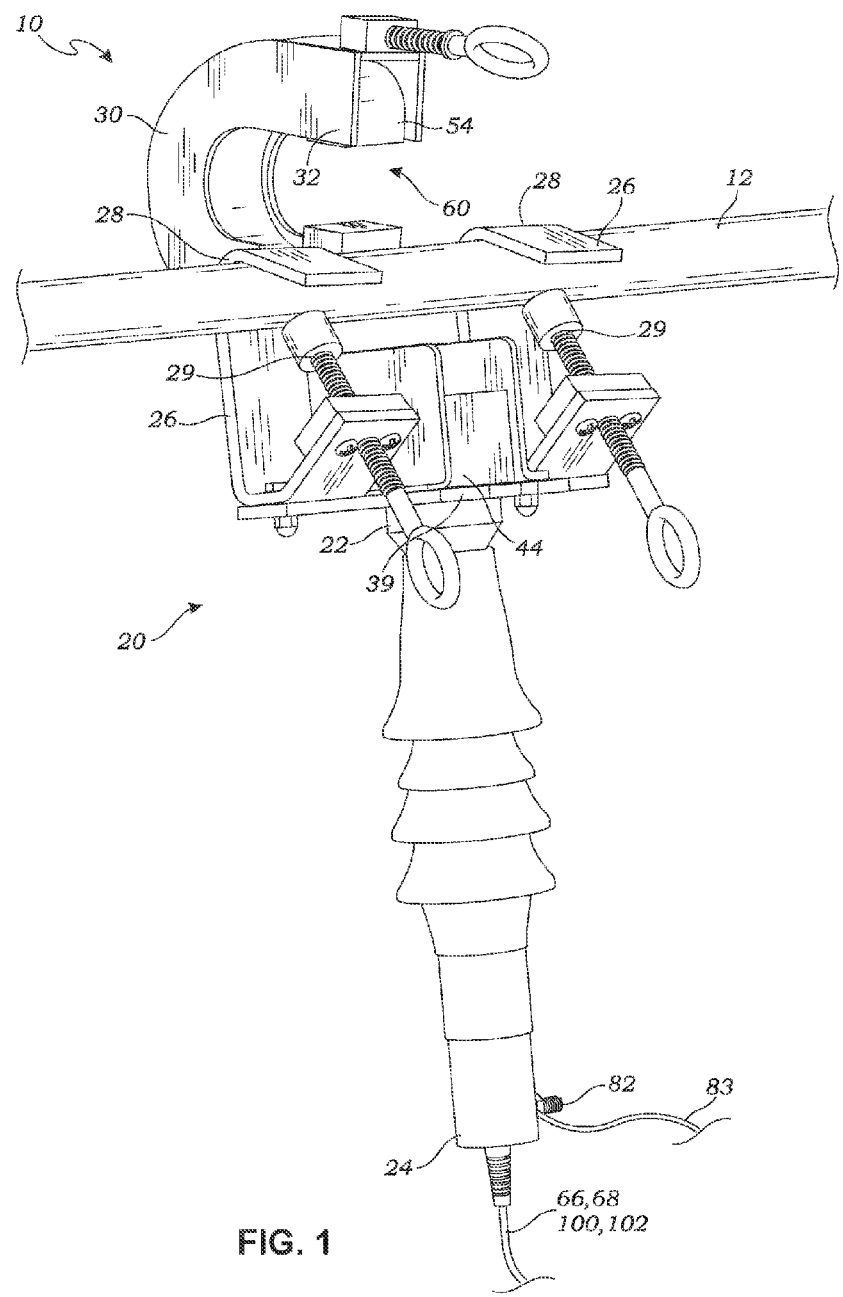
FIG. 1 is a perspective view of an optical sensor assembly when a magnetic concentrator is in open position, according to an aspect of the present disclosure.

While aspects of the present disclosure are susceptible to various modifications and alternative forms, specific embodiments or implementations have been shown by way of example in the drawings and will be described in detail herein. It should be understood, however, that this disclosure is not intended to be limited to the particular forms disclosed. Rather, this disclosure is to cover all modifications, equivalents, and alternatives falling within the spirit and scope of the invention as defined by the appended claims.

DETAILED DESCRIPTION

Figure 2:
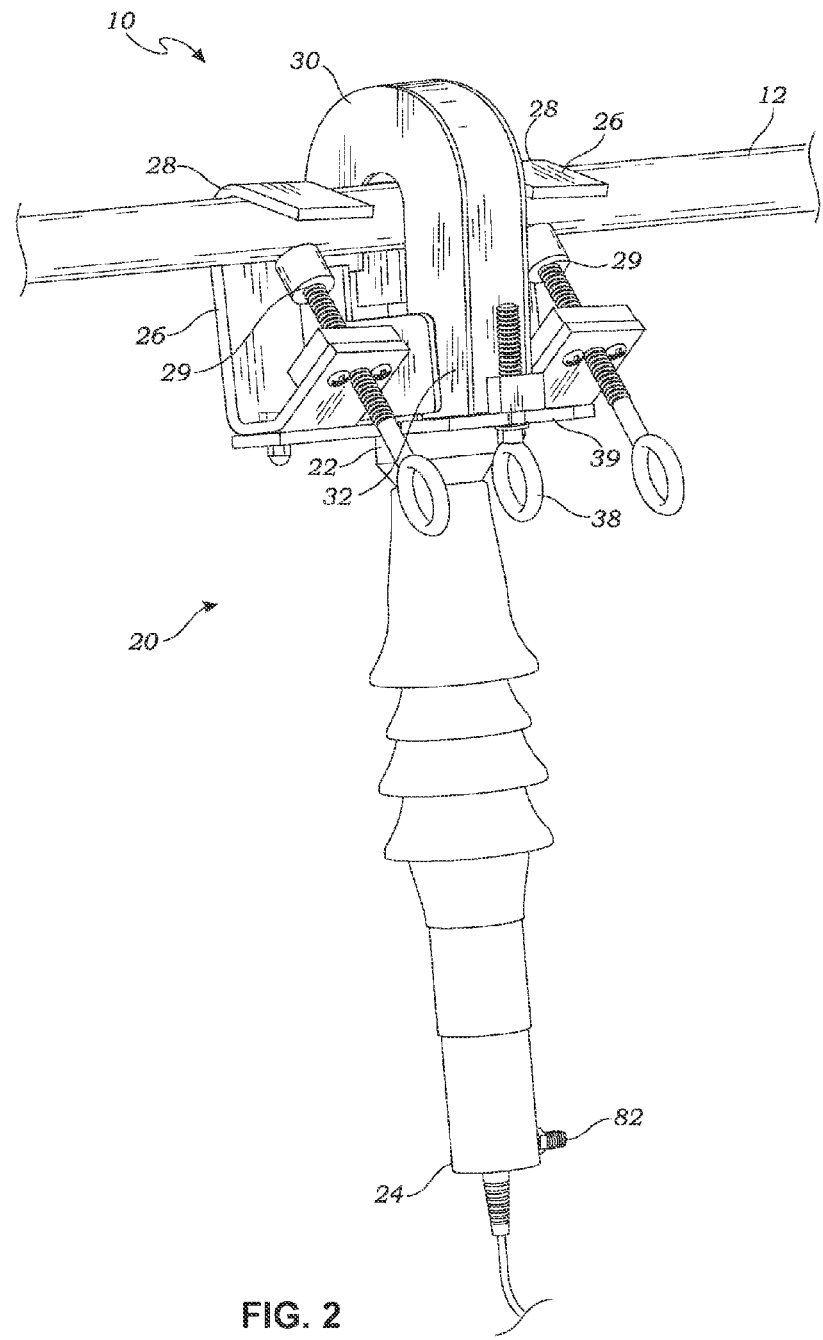
FIG. 2 is a perspective front view of FIG. 1 showing the magnetic concentrator is in a closed position.

FIG. 1 is a perspective view of an aspect of an optical sensor assembly 10 showing a magnetic concentrator 54 in an open position that has not yet been placed in a position to encompass or partially encompass a current carrying cable 12. In this position, the current carrying cable 12 is still firmly held by the optical sensor assembly 10. FIG. 2 is a perspective front view of FIG. 1, showing the magnetic concentrator 54 in a closed position and a housing 30 locked in place by a locking element 38.

Referring to FIGS. 1 and 2, a base unit 20, which extends from hooks 26 to the bottom (relative to earth) of the optical sensor assembly 10, uses two hooks 26, as shown, for hanging the base unit 20 from a current carrying cable or conductor 12. Only one hook, by itself, or, optionally, with ties, strapping or other structures can be used. A pair of hooks 26 are arranged, one on either side of an optical current sensor 40. Each of the hooks 26 can include a curved portion 28 configured to firmly hold the base unit 20 to the current carrying cable 12.

As illustrated in FIGS. 1-4, each hook 26 can further include a clamp 29, such as a screw clamp as illustrated, although other clamps and equivalent fasteners may be used. The words "clamp" and "clamps" are intended to include such alternative constructions which will firmly hold the base unit 20 in fixed position relative to the current carrying cable 12 at least when the housing 30 is closed. The illustrated clamp 29, forces the current carrying cable 12 against the curved portion 28 of the hook 26 to secure the base unit 20 to the current carrying cable 12, so that the assembly remains physically stable relative to the cable even in rough weather conditions.

The "current" in a power distribution cable or conductor, (and even in other current carrying wires or cables), can be comprised of a plurality of components having a myriad of amplitudes and frequencies, as well as direct currents, (DC). As used herein, "current" is intended to comprehend a "single current" (that is, a current of singular amplitude and singular frequency and, also, DC current), and, as well, "a current having a plurality of component current frequencies or amplitudes, or both, as well as, DC." The terms cable and conductor are synonymous, and a cable can be insulated or non-insulated.

Figure 5:
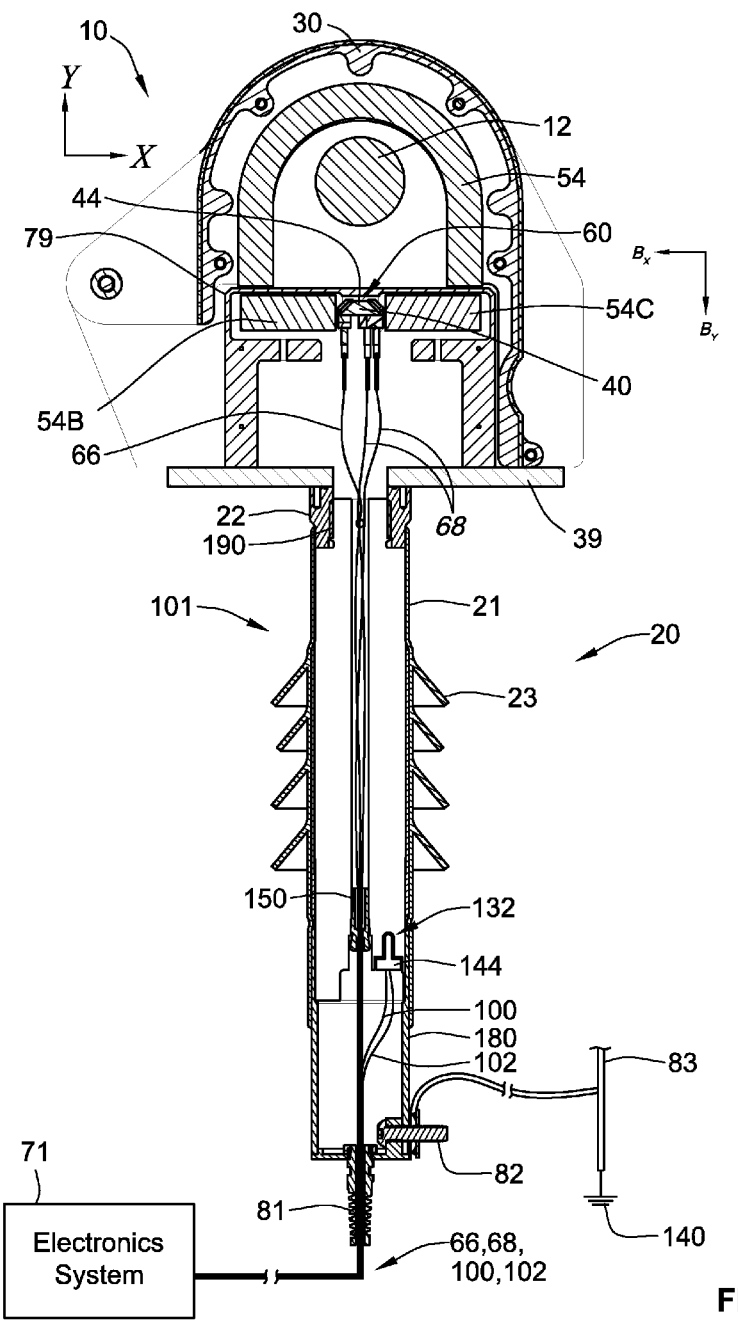
FIG. 5 is a side elevation, cross-section view of a powder core magnetic concentrator, closed, as in FIGS. 2 and 4, in relation to the cable and the current sensor. The magnetic concentrator further illustrates the airgap in the magnetic concentrator, according to an aspect of the present disclosure.

When the optical sensor assembly 10 is hung on the current carrying cable 12, the optical sensor assembly 10 is held firmly to the cable 12 regardless of whether the magnetic concentrator 54 is open or closed. The cable 12 can be held in a fixed position relative to the body of the optical sensor assembly 10, as shown, or, alternatively, with the clamps 29 held in a fixed position with respect to the movable magnetic concentrator 54. In a closed, operating position, the magnetic concentrator 54 encircles the cable 12 or a sufficient amount thereof so as to pick up the magnetic field induced by the current flowing through the cable 12 and extend the magnetic field to the magnetic concentrator's airgap 60 in which the optical current sensor 40 is disposed when in an operating position. FIG. 5 shows the optical current sensor 40 positioned within the airgap 60. Further, the magnetic field provided by the magnetic concentrator 54 is strong enough to exclude stray, undesired magnetic fields, or else, suitable means against them can be provided.

Among the alternatives to hooks, clamps, fasteners and the like, for holding the current-carrying cable, it is to be appreciated that plastic ties, wires, ropes, chains, and all sorts of means may be devised for firmly holding the current-carrying cable with respect to the optical sensor assembly. "Clamps" is intended to cover all sorts of hooks, fasteners, jaws, wedges, vices and other devices adapted or adaptable to the firmly holding of the cable 12.

A concentrator housing 30 is pivotally attached at the top of the optical sensor assembly 10 and partially encloses the magnetic concentrator 54 and, when in operation, holds it around the current carrying cable 12. The concentrator housing 30 has a first end 32 and a second end 34, illustrated in FIGS. 3 and 4. By also referring to FIGS. 3 and 4, it can be seen that a pivot 36 of the second end 34 of the concentrator housing 30 pivotally attaches the concentrator housing 30 such that the concentrator housing 30 moves both itself and the magnetic concentrator 54 between an open position and a closed position. Other constructions are contemplated to properly position the magnetic concentrator 54 around the current carrying cable 12, at least during operation of the optical sensor assembly 10.

The structure holding the cable 12, magnetic concentrator 54, and other elements of the optical sensor assembly 10, is rigidly designed to minimize vibrations that cause erratic readings in the system. It is to be appreciated that, in operation, the cable 12 is fixedly held, either with respect to the body of the optical sensor assembly 10, or fixed with respect to the magnetic concentrator 54, whether the magnetic concentrator 54 is open or closed. For example, the cable 12 is fixedly held with respect to the body of the optical sensor assembly 10, rather than to the magnetic concentrator 54.

Figure 3:
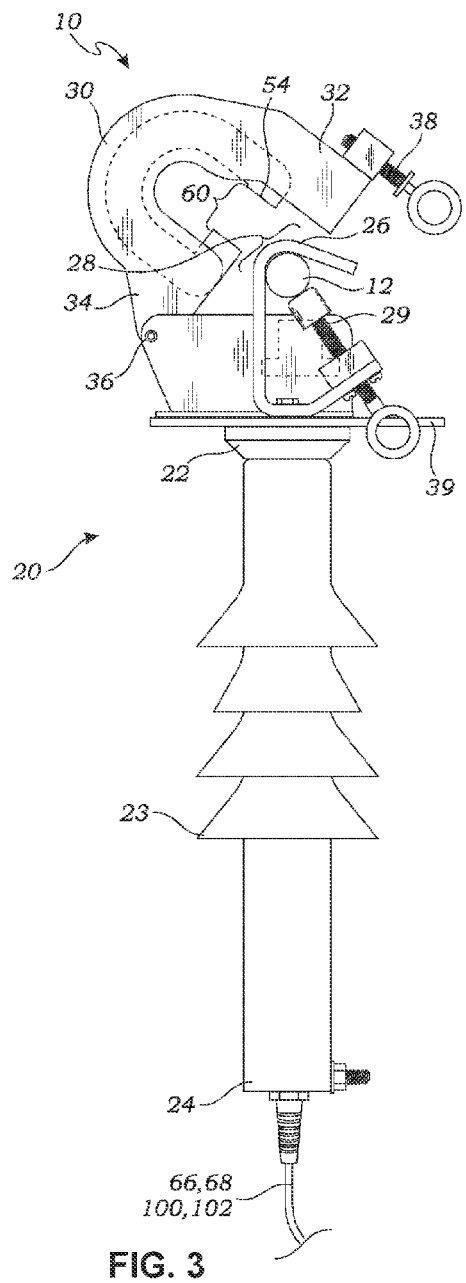
FIG. 3 is a side elevation view of FIG. 1 showing the magnetic concentrator in the open position.
Figure 4:
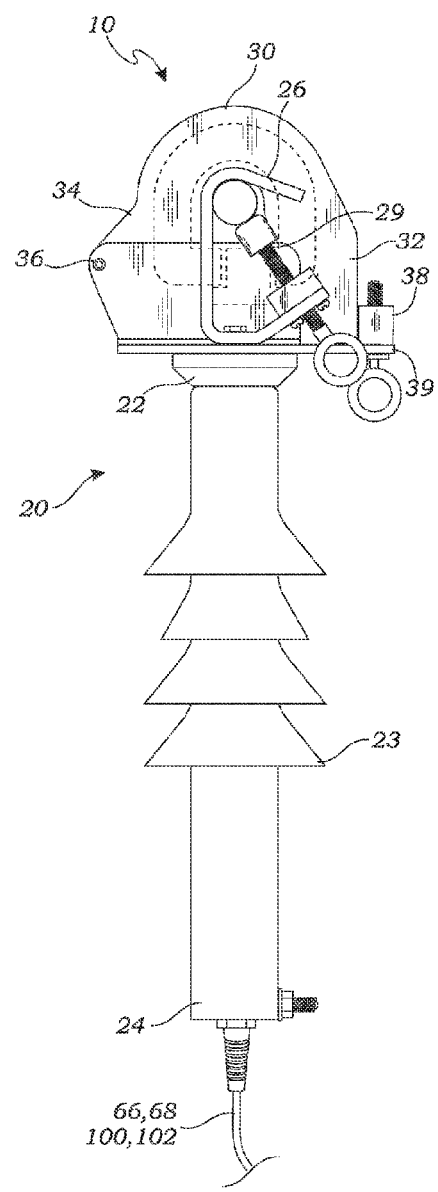
FIG. 4 is a side elevation view of FIG. 2, showing the magnetic concentrator in the closed position.

FIGS. 3 and 4 are side elevations of the optical sensor assembly 10. Referring to FIGS. 3 and 4, in the open position shown FIG. 3, the concentrator housing 30 is moved away from the base unit 20. In FIG. 4, showing the closed position, the concentrator housing 30 positions the magnetic concentrator 54 around the current carrying cable 12 such that the current carrying cable 12 passes through the airgap 60 to the interior of the magnetic concentrator 54 without physically touching the magnetic concentrator 54 or the concentrator housing 30. Other constructions are contemplated in which the cable 12 does not pass through the airgap 60.

A locking element 38 is provided for removably securing the first end 32 of the concentrator housing 30 to the base unit 20 in the closed position. In the illustrated example, the locking element 38 is a screw-type clamp attached to the concentrator housing 30 that removably engages a flange 39 of the base unit 20. The locking element 38 locks the concentrator housing 30 in the closed position, thereby maintaining the magnetic concentrator 54 in its position, which creates a magnetic field around an optical current sensor 40 (not shown) that lies within, or in some aspects, partially within, the airgap 60 of the magnetic concentrator 54.

The portion of base unit 20, from the flange 39 downward (toward earth), is encased in a high-dielectric insulator 21, having outer flanges, such as a flange 23, which substantially increase the external electric arcing path on the outer surface of the base unit 20. Those skilled in the art know what material or combinations of materials can be used, such as, but not limited to, a high dielectric elastomer, rubber, silicon rubber or various other materials. Such outer coverings, or sleeves, are commercially available and can be stretched, form-fitted, previously molded or cold or heated, shrink-fitted to the body of the insulated device. Other suitable outer surface layers can be utilized having high dielectric insulation, suitable by having high voltage breakdown, weathering and temperature withstanding characteristics.

FIG. 5 is a side elevation, cross-section view of the magnetic concentrator 54, in relation to the current carrying cable 12 and the optical current sensor 40. As illustrated in FIG. 5, the optical current sensor 40 includes a polarized light input 42 and a light directing device, which in this example is a reflective prism 44. The polarized light input 42 is operably connected to receive and polarize the light beam from a light source 48, which can be by way of example, but not limited to, a LED or a laser, and the light output 46 is operably connected to provide a light output to a light analyzer in the electronics system 71. Polarized light is directed into the reflective prism 44 as a polarized light beam. In the reflective prism 44, the portion of the polarized light beam, parallel to the magnetic field, $B_x$, is rotated in its polarization by being exposed to the magnetic field. The rotated, polarized beam of light is reflected out the light output 46, and to the light analyzer in the electronics system 71 that senses this rotation, which represents the current magnitude, (and many other characteristics of the current), and the current direction in the cable 12.

Light detectors, as part of the light analyzer, but in this example are located remotely in an electronics system 71, convert the output polarized, rotated light signals from the optical current sensor 40 in one or more output optical fibers 68 into corresponding electrical signals so that they can be analyzed and evaluated by the electronics system 71.

In the discussion herein, the words "optical," "optics," "electro-optical" and the like are used for brevity and clarity. However, it is intended that those terms, as used herein, are intended to cover frequencies of electromagnetic radiation not only inside the visible spectrum, but also frequencies outside the visible spectrum. Such meanings are commonly accepted by those of ordinary skill in the art to which the present disclosure pertains. Also, it is commonly understood by those skilled in the electro-optical art that "light" and "polarized light" include both frequencies inside and outside of the visible spectrum. Suitable examples of "light" outside the visible spectrum include infrared and ultraviolet frequencies. Of course, the selected frequency or frequencies are those, preferably, for convenience, economics and reliability for which there are suitable electrical components available as to sources, conductors, transmitters, detectors, and so forth. Near infrared frequencies, say, for example, but not with limitation, 800 nm to 900 nm are well-suited for meeting the requirements for application to the optical sensor assembly 10 described herein and also for which there are suitable electrical components readily available. Infrared frequencies, particularly, the near infrared, are those commonly used in similar optical devices and are suited for use herein.

Examples of a suitable optical current sensor that can be used as the optical current sensor 40 herein are disclosed in co-pending U.S. Provisional Patent Application No. 61/823,849, filed on May 15, 2013, entitled "Electro-Optic Current Sensor With High Dynamic Range and Accuracy," and U.S. patent application Ser. No. 13/553,486, filed Jul. 19, 2012, entitled "Optical Sensor Assembly For Installation on a Current Carrying Cable."

Referring still to FIG. 5, the magnetic concentrator 54 has a gap that defines an airgap 60. The magnetic concentrator 54 is mounted, within a housing 30 that is pivoted, (not shown), so that it fits around the current carrying cable 12 when the base unit 20 is hung from the current carrying cable 12 by the at least one hook 26. When the concentrator housing 30 is moved to the closed position, the reflective prism 44 is operably positioned in the airgap 60 of the magnetic concentrator 54.

The distance between the magnetic concentrator 54 and the current carrying cable 12 is adjusted so that magnetic concentrator 54 creates an optimum magnetic output, or, at least, a suitable output so that a magnetic flux density ($B_x$) is present in the airgap so that parameters of the optical current sensor, including the optical path length (the distance across the airgap), and the Verdet constant of the glass material (e.g., of the prism 44) across the airgap are optimized for sensing the current flowing through the cable 12.

The path of the beam within the light directing device, such as the prism 44, can be closely aligned with the lines of force of the magnetic field. If this is done, a more precise, rotated output and, consequently, more precise corresponding electrical signals can be generated therefrom. Depending on the current sensor 40, and, particularly the light directing device, such as prism 44, other angular alignments are contemplated.

The light directing device, which, in FIG. 5 is a reflective prism 44, can have any shape, prism or otherwise, that directs the light from a polarized light input to a light output. In the illustrated example, the reflective prism 44 is a prism having a pair of sloped reflective surfaces for directing the beam as described above. Glass provides benefits such as low temperature sensitivity. Other materials and shapes of reflective prism 44, its reflective surfaces and fiber optics configuration can alternatively be used. Some of such possibilities are disclosed in co-pending U.S. Provisional Patent Application No. 61/823,849, filed on May 15, 2013, entitled "Electro-Optic Current Sensor With High Dynamic Range and Accuracy."

The light directing device can be a material selected from the group of near optical grade glass, or better, bulk glass, diamagnetic glasses, crystals, including, particularly, ferromagnetic crystals, polymers, doped polymers and other materials, having polarized light directing properties and susceptible to the Faraday effect upon such polarized light, and having minimal temperature sensitivity or having a temperature sensitivity that can be suitably corrected or compensated for.

Many optical grades of glass or near optical grade and other bulk glass items are well-suited for a light directing device, including for a reflective prism. Some of the most sensitive materials of this kind are diamagnetic glasses and magnetic crystals.

Other glasses, crystals, polymers, doped polymers and various other materials, mixtures and compounds are also suitable, provided they conduct polarized light, are susceptible to the Faraday effect for a suitable range of current causing a rotation of the polarized light, and have minimal temperature sensitivity, or a temperature sensitivity that can be corrected, compensated for, calibrated for or otherwise accounted for. They should also have a suitable frequency response to provide information suitable for analysis and evaluation of one or more of spectral content, harmonics, stray frequencies, and other factors in determining quality.

Glass, crystal or other materials can be found used for the light directing device herein, if they are transmissive of polarized light beams, electro-optically sensitive to the Faraday effect, capable of sensing a wide bandwidth of magnetic frequencies, have a wide range of response to magnetic fields and have no deficiencies, including temperature sensitivity or other deficiency, that cannot be corrected for, by monitoring, or by "look-up" tables or mathematical formulas in a computing device or by other means.

From any such light directing device the optical sensor assembly 10 combined with the electronics system 71 can provide the capability for determining current quality, which is hereby defined as including one or more of identification, measurement, display and indication, analysis, evaluation and reporting of one or more of current levels, spectral content, harmonics, transients, impedance, faults, fault locations, surges, spikes and power factor and any other characteristics of value or of interest.

Determination of impedance depends on a measured voltage between the potential of the current carrying cable 12 and another reference potential, such as ground 140, and power factor can be determined by having the locations or points of the zero crossings in the measured voltage signal (i.e., where the alternating voltage waveform crosses zero volts).

The beam of polarized light 52, at some intermediate length within the reflective prism 44, can be closely aligned to be parallel with the magnetic field in the airgap 60. The magnetic field in the airgap 60 rotates the plane of polarization of the polarized light 52 within the reflective prism 44. This is also sometimes referred to as a "shift" between polarized light components. The amount of rotation is proportional to the strength of the magnetic field in the airgap 60 and the amount of rotation is measurable by a light analyzer in the electronics system 71 to determine a characteristic (e.g., magnitude) of the current flowing through the current carrying cable 12.

In FIG. 5, the optical current sensor 40 is positioned within the airgap 60 formed between two opposing magnetic concentrator segments 54B and 54C of the magnetic concentrator 54. Current carrying cable 12 is shown within the central portion of magnetic concentrator 54. The magnetic field of the magnetic concentrator 54A is carried through aluminum panel 79, (which lies between the upper part of the core 54 and the lower magnetic segments 54B and 54C, and is part of a larger structure enclosing items lying below magnetic concentrator 54). The magnetic field extends through the aluminum panel 79 into the magnetic segments 54B and 54C, which create a magnetic field in the airgap 60 that lies between them. The light directing device, in this instance, a prism 44, is located within that airgap 60 and receives a beam of polarized light from a polarizer. Such polarized beam of light is then further rotated within prism 44, (in accordance with the magnetic field, $B_X$, which is created by the magnetic concentrator 54 from current in the cable 12), by Faraday effect, thus, providing much output information (e.g., magnitude) concerning the current in cable 12, as polarized light to a polarizing beamsplitter from which two polarized light beams are provided to optical fiber light connections that are coupled to one or more output optical fibers 68.

In the example shown in FIG. 5, the magnetic concentrator 54 has a powder core composed of a magnetic powder mixed with at least one type of non-magnetic material and having miniature distributed airgaps throughout the magnetic concentrator 54. A powder magnetic core having high saturation level and a narrow hysteresis loop, (to reduce the power loss), can be utilized herein.

One or more output optical fibers, generally designated by reference number 68, connect to receive one or more output polarized, rotated light beams from a polarizing beamsplitter through corresponding fiber light connections without any optical sensor or amplifier. Alternately, an optical sensor or amplifier can be used, but in this example, nothing but simple optical fiber light connections connect the one or more output optical fibers 68 to receive the output(s) of a polarizing beamsplitter in the optical current sensor 40.

The one or more output optical fibers 68 carry the output light beams (which are rotated, polarized light beams) to be converted into corresponding electrical signals by light detectors at the input of the electronics system 71. Such output information in the one or more optical fibers 68 because of the dynamic characteristics and ability of the magnetic concentrator 54 and great sensitivity and dynamic ability of electro-optical light directing devices, such as the prism 44, includes a myriad of information concerning the current quality, including, but not limited to, current level, spectral content, harmonics, stray frequencies, transients, surges and spikes. Impedance and power factor can also be determined if voltage information is available.

Due to saturation, magnetic concentrators, which readily saturate, have a limited dynamic range of current sensing. An electric utility company has various requirements for the dynamic range of current to be measured, depending on the application. For example, a normal operating range can extend from at least as low as approximately 5 amperes to about 600 amperes and fault ranges of 10 times the normal operating range and, even, up to about 40 times the normal operating range. At those ranges, a ratio, or scaling, is required. Optical current sensing together with detection (changing "light" to electrical signals) provides ready ratio conversion, which is easily changed to another ratio, as necessary. The industry has agreed that a current ratio of about 100 amperes to 1 volt can generally be used, for normal operating range, which would allow 1000 amperes to be measured without distortion. However, for fault detection, a greater current ratio, say, 1000 amperes to 1 volt, measured in real time, would be required. Of course, rather than trying to fit excessive current into a range measurement system, a simple detector indicator can be used to determine and indicate when the current has exceeded 1000 amperes. Some other selected excessive value may be used as a maximum if required. This information can be provided, simply, when current exceeds the values within the normal current range or ranges.

On the other hand, scaling can, in effect, be determined by a system that has a wide current sensing capability and the electronics system 71, such as a computing device, which utilizes the data pertaining to the current range of interest and discards or ignores measurements outside that range of interest.

A high saturation level is achieved by the magnetic concentrator 54, thanks to a compressed powder core having magnetic particles dielectrically insulated from each other in a dielectric matrix and minute airgaps distributed within the powder core. The powder core can be comprised of various magnetic powders, such as iron-containing particles, silicon iron-containing particles, silicon steel-containing particles, and other mixtures, alloys, and compounds of iron and steel.

For lower current measuring, higher permeability cores are used and for higher current measuring, lower permeability cores are used. Suitable magnetic cores can also be constructed, for example, of laminations of silicon steel held together by one or both of an adhesive or an epoxy, or other suitable matrix. Smaller, narrower, lamination strips are useful for efficiency at higher frequencies of current detection and larger, wider lamination strips are useful for lower frequencies of current detection. Laminations made of powdered core materials are also useful.

Narrow hysteresis curves in the magnetic concentrator are desirable and will substantially reduce the power losses and the measurements will be more linear, leading to more accurate measurements.

The magnetic concentrator 54 is easily clamped onto existing cables 12 without cutting the cables 12 (note, typically, high voltage current-carrying cables in above-earth, medium-to high-voltage distribution systems are not insulated), and provides a very high dynamic range. The magnetic concentrator 54 can be of any shape that functions to provide the necessary magnetic field to an airgap, such as the airgap 60, within which an optical current sensor, such as the optical current sensor 40, can be placed.

By properly selecting the magnetic concentrator 54 and adapting the electronics 71, the sensors 40 can be used for multiple applications. For example, assume a 600 ampere nominal current sensor 40 is capable of measurement of very high momentary fault current (e.g., approximately equal to or greater than 5,000 amperes). The electronics 71 are fast, high in bandwidth, but lower in gain and accuracy at that level. For current less than 1 ampere it is desired to measure at a lower bandwidth for several reasons. A normal harmonic content should be less than 5% and 5% of 1:600 ampere is negligible (0.000083 ampere) for metering and for quality of power. Therefore, a bandwidth of about 200 Hz is acceptable at this current. Current state of electronics allows dynamic adjustment of the gain and the bandwidth. The electronics system 71 disclosed is capable of filtering, through the use of filters or by computer data processing and, thus, is able to provide information down to 0.1 Hz.

The lower limit is the noise floor of the signal being processed, which is determined mostly by the source of the beam(s) and of the electronics, and the higher limit is the current at, or just below, saturation of the magnetic concentrator 54 and the power supply levels of the electronics.

For a voltage sensor 144 (FIG. 5), an input optical fiber 100 supplies an input light beam, from a LED or laser, (which components are well-known in the art), to a voltage sensor area (shown as an electric field space 132 in FIG. 7, in which an electric field commensurate with a voltage potential difference is present). The voltage sensor 144, for example, can be sensitive to the Pockels effect inside the electric field space 132, and can be used in conjunction with the current sensor 40. One or more output optical cables 102 provide the outputs from the voltage sensor 144 placed in the electric field space 132, and are coupled to the electronics system 71 for converting into one or more characteristics (e.g., magnitude) of voltage, including impedance, power fact, and other characteristics ascertainable from voltage measurements.

Thus, by the use of optical fibers 66, 68, 100, 102, the electronics components in the electronics system 71 can be located remotely (a safe distance away) from the high voltage, current-carrying cable 12, such that deteriorating effects of high voltage transients, lightning, and other weathering conditions on the electronics parts can be reduced, suppressed, or eliminated.

If a laser is used as the light source 48, the light beam produced by the laser will likely need to be depolarized and then collimated in order to be suitably polarized at the input to the light directing device, prism 44. If a LED is used as the light source 48, the light beam produced will need to be collimated in order to be suitably polarized at the input to the light directing device, prism 44. Of course, other suitable light-emitting devices can be used instead.

Computing devices (computers, digital signal processors, microprocessors, and the like) in the electronic system 71, receiving information through the output optical fiber cables 68, 102 from the current sensor 40 and the voltage sensor 144, respectively, provide an evaluation and mathematical analysis to determine such quality factors from electrical signals representative of the measured current and the measured voltage, such as impedance and power factor. From the measured voltage, the electronics 71 can analyze harmonics, transients, spikes and voltage anomalies in the electrical distribution system in which the cable 12 is installed. For example, to assess power quality, the electronics 71 measures or calculates harmonics and other frequency components in the measured current, so higher bandwidths, such as 45 Hz to 6000 Hz can be used.

Returning to FIG. 5, a collar-like top end or metal cap 22 of a lower base unit 20 lies under the flange 39. The flange 39 and the top end 22 are electrically connected together and are electrically conductive of the voltage potential on the cable 12 when the optical sensor assembly 10 is clamped to such cable 12. The clamp 29, which is adjustable by locking element 38, is shown clamped on the cable 12 in FIGS. 2 and 4, holding it firmly with respect to the optical sensor assembly 10. There are two of such clamps 29, one on each side of housing 30.

At the bottom of the optical sensor assembly 10 is a pass-through connector 81, through which the input and output optical fibers 66, 68, 100, 102, and any other necessary or desirable light or electrical conductors pass and exit (or enter) the lower base unit 20. A ground stud 82 is also shown in FIG. 5 connected to an optional ground pole 83, which in turn is connected to a ground potential 140 (e.g., earth).

Figure 6:
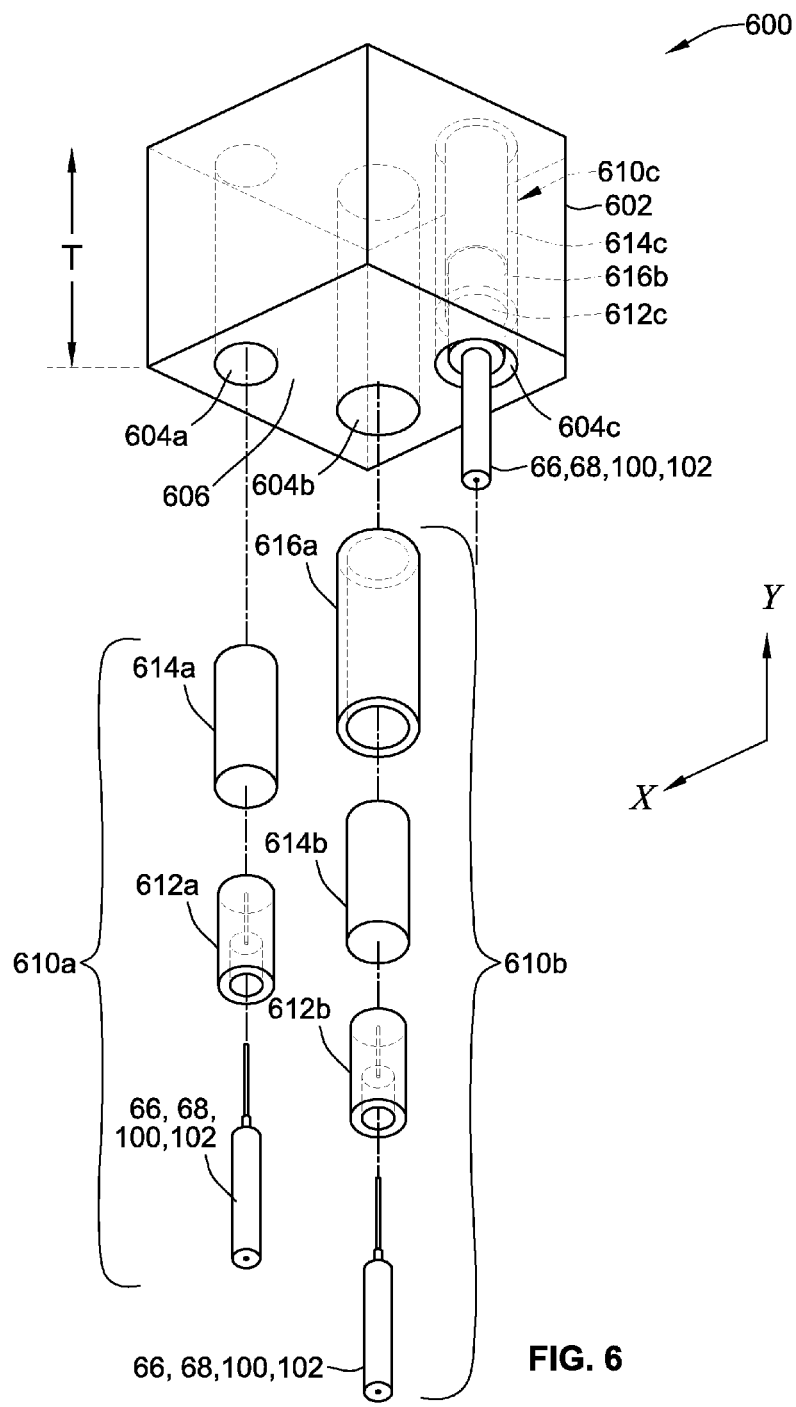
FIG. 6 is an isometric view of a collimator holder that accepts optical fiber collimators two different types of collimator assemblies within holes formed within the holder.

Referring now to FIG. 6, a collimator holder assembly 600 is shown that can be used in conjunction with any electro-optical sensor, such as any current (electro-optical) sensor 40 or any voltage (electro-optical) sensor 144, disclosed herein. FIG. 6 illustrates some of the general principles of the collimator holder, which are applicable to any of the embodiments shown and described in FIGS. 7-17. Starting with reference number 600, the last two digits are used throughout FIGS. 7-17 to refer to like elements. Reference numbers 600 or higher may be immediately followed by a letter, such as a, b, or c, to different like elements from one another; however, the element may generally be referred to hereafter without the letter to refer to any or all such like elements.

A collimator holder 602 is shown having three channels 604*a*, 604*b*, 604*c* formed therein. These channels 604*a*, 604*b*, 604*c* have a uniform length and radius, and extend all the way through a thickness, T, of the collimator holder 602. These channels 604*a*, 604*b*, 604*c* are mutually parallel, as precisely as manufacturing tolerances permit as discussed further below. Two different types of collimator assemblies 610*a*, 610*b*, 610*c* are shown in FIG. 6 for ease of discussion. Note that all of the collimator assemblies 610*a*, 610*b*, 610*c* used in an embodiment can all be of one type or the other type, or in another embodiment, the collimator assemblies 610*a*, 610*b*, 610*c* can have different types. The radius of the channels 604*a*, 604*b*, 604*c* is adjusted to accommodate the largest diameter of the collimator assembly 610*a*, 610*b*, 610*c* inserted therein, for reasons that will be explained further below.

A first type of collimator assembly 610*a* includes an optical fiber 66, 68, 100, 102, a fiber optic ferrule 612*a*, and a lens 614*a*, such as a gradient-index or GRIN lens. To assemble the collimator assembly 610*a*, the optical fiber 66, 68, 100, 102 is inserted into and secured to the ferrule 612*a* (to form a fiber pigtail ferrule), and the pigtail ferrule is bonded (e.g., using epoxy) to the GRIN lens 614*a*. A second type of collimator assembly 610*b*, 610*c* adds a tube 616*a*, such as a glass tube, which encapsulates or surrounds at least the GRIN lens 614*b* and optionally some or all of the ferrule 612*b*. The tube 616*a* is bonded, such as by an epoxy, to the GRIN lens 614*b* and has a thermal expansion coefficient that matches that of the GRIN lens 614*b*. Thus, the second type of collimator assembly 610*b*, 610*c* includes an optical fiber 66, 68, 100, 102, a fiber optic ferrule 612*b*, a GRIN lens 614*b*, and a tube 616*a*, 616*b* that surrounds at least the lens 614*b*, and optionally part or all of the ferrule 612*b*. As noted above, the diameter of the second channel 604*b* can be slightly larger than a diameter of the first channel 604*a* to accommodate the additional thickness supplied by the tube 616*a*. The collimator holder 602 has a bottom surface or face 606 away from which the optical fibers 66, 68, 100, 102 extend.

The tube 616 helps to provide structural rigidity to the collimator assembly 610, and also helps to co-align the ferrule 612 and the lens 614 with the optical fiber 66, 68, 100, 102. The tube 616 also provides a larger surface to bond with the collimator holder 602 inside the channel 604, ensuring precise alignment and centering within the channel 604 and facilitating the assembly process. But the tube 616 can be eliminated in other embodiments, such that that the lens 614 is directly bonded to the collimator holder 602 inside the channel 604. Strict manufacturing tolerances should be observed to ensure that the lens 614 remains co-aligned with the optical fiber 66, 68, 100, 102 as the collimator assembly 610*a* is bonded to the collimator holder 602 inside the channel 604*a*. The tubes 616*a*,*b*,*c* can be made of glass or ceramic, and are cylindrical in shape with a hollow channel to form a hollow pipe.

A thermal expansion coefficient of the collimator holder 602 is substantially the same as a thermal expansion coefficient of the tube 616. This allows the tube 616 and the collimator holder 602 to expand and contract at the same rate over a range of temperature. By "substantially the same," it is meant that within industry accepted tolerances, the thermal expansion coefficients are as close to the same as tolerances allow, although a minor deviation is acceptable. The imprecise nature of language prevents any more precision, but the intent here is to match as much as possible the thermal expansion coefficients. They can differ slightly such that the tube 616 and collimator holder 602 expand and contract at the same rates within a range of thermal expansion coefficients without causing any bending or misalignment of the collimator assemblies 610 within the collimator holder 602 or between the lens 614 and a crystal assembly, described in more detail below. Likewise, the thermal expansion coefficient of the glass or ceramic collimator holder 602 can be substantially the same as the thermal expansion coefficient of the GRIN lens 614 and/or that of the ferrule 612.

The channels 604 are precision-machined within the collimator holder 602, which can resemble a block, although it can take any form, and is composed of a glass or a ceramic. The channels 604 are parallel with one another, and are formed wherever the input and output optical fibers need to be positioned relative to the crystal assembly of the electro-optical sensor 40, 144. As explained below in connection with FIGS. 13 and 14, the collimator assemblies 610 are bonded to inner surfaces of the channels 604 of the collimator holder 602 by a thin, evenly applied layer of epoxy, which may have a higher thermal expansion coefficient compared to that of the collimator holder 602 and the tube 616 or lens 614. However, expansion or contraction at the interfaces between adjacent components along the z-axis direction (orthogonal to the direction of light from the optical fibers 66, 68, 100, 102) is not as great a concern. To minimize the contribution of thermal expansion from the epoxy, the annular thickness of the applied epoxy is very thin and even creating a consistent surface tension across the interface between the collimator holder 602 and the tube 616 or the lens 614, so as the epoxy expands and contracts, the collimator assembly 610 stays generally centered within the channel 604. Tight tolerances on the machining of the channels 604 and the size of the tube 616 or the lens 614 also contribute to effecting self-centering of the collimator assembly 610 within the channel 604.

The thickness or height, T, of the collimator holder 602 can be at least as great as a length of the lens 614. Alternately, the thickness T of the collimator holder can be between 50-100% of the length of the collimator assemblies 610. As the thickness increases, the machining accuracy of the channels 604 decreases, but the rigidity and centeredness of the collimator assemblies 610 within the channels 604 increases. Thus, the dimension of the thickness, T, is a tradeoff between machining accuracy and collimator rigidity. In an example, if the overall length of the lens 614 and the ferrule 612 is 10 mm, the thickness of the collimator holder 602 can be 8 mm, or about 80% of the overall length of the lens 614 plus the ferrule 612. Other ratios between T and the combined length of the lens and ferrule can be achieved as a function of the tradeoff mentioned above. For example, if a shorter lens 614 is used, then the thickness T of the holder 602 can be reduced.

In FIG. 6, one of the collimator assemblies 610*c* is shown fully inserted into the channel 604*c* of the collimator holder 602 with the optical fiber 66, 68, 100, 102 protruding away from the bottom surface 606 of the collimator holder 602. Any of the optical fibers 66, 68, 100, 102 can be an input optical fiber, in which light from a light source is provided to a crystal assembly, or an output optical fiber, in which light affected by an electric field (due to Pockels effect) or a magnetic field (due to the Faraday effect), exits the crystal assembly. The input optical fibers can have different ferrules and/or lenses 614 from those of the output optical fibers, and the corresponding channels 604 into which the input and output optical fibers are inserted are dimensioned and positioned accordingly within the collimator holder 602.

Figure 12:
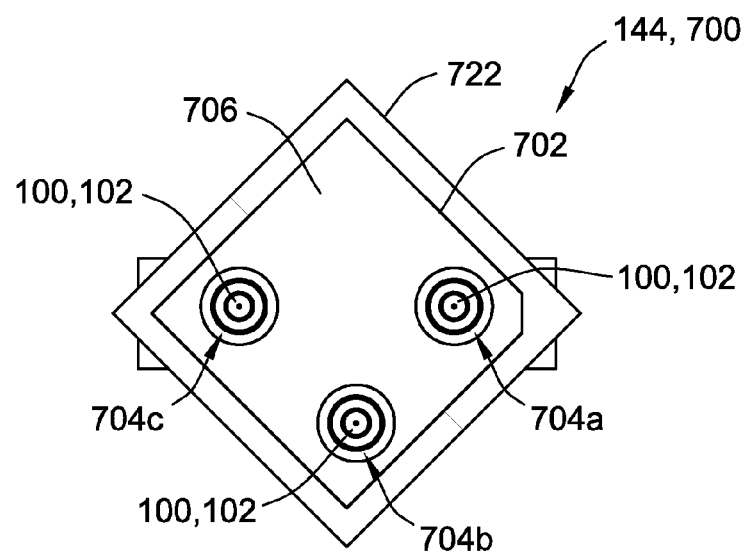
FIG. 12 is a bottom view of the sensor shown in FIG. 7.
Figure 13:
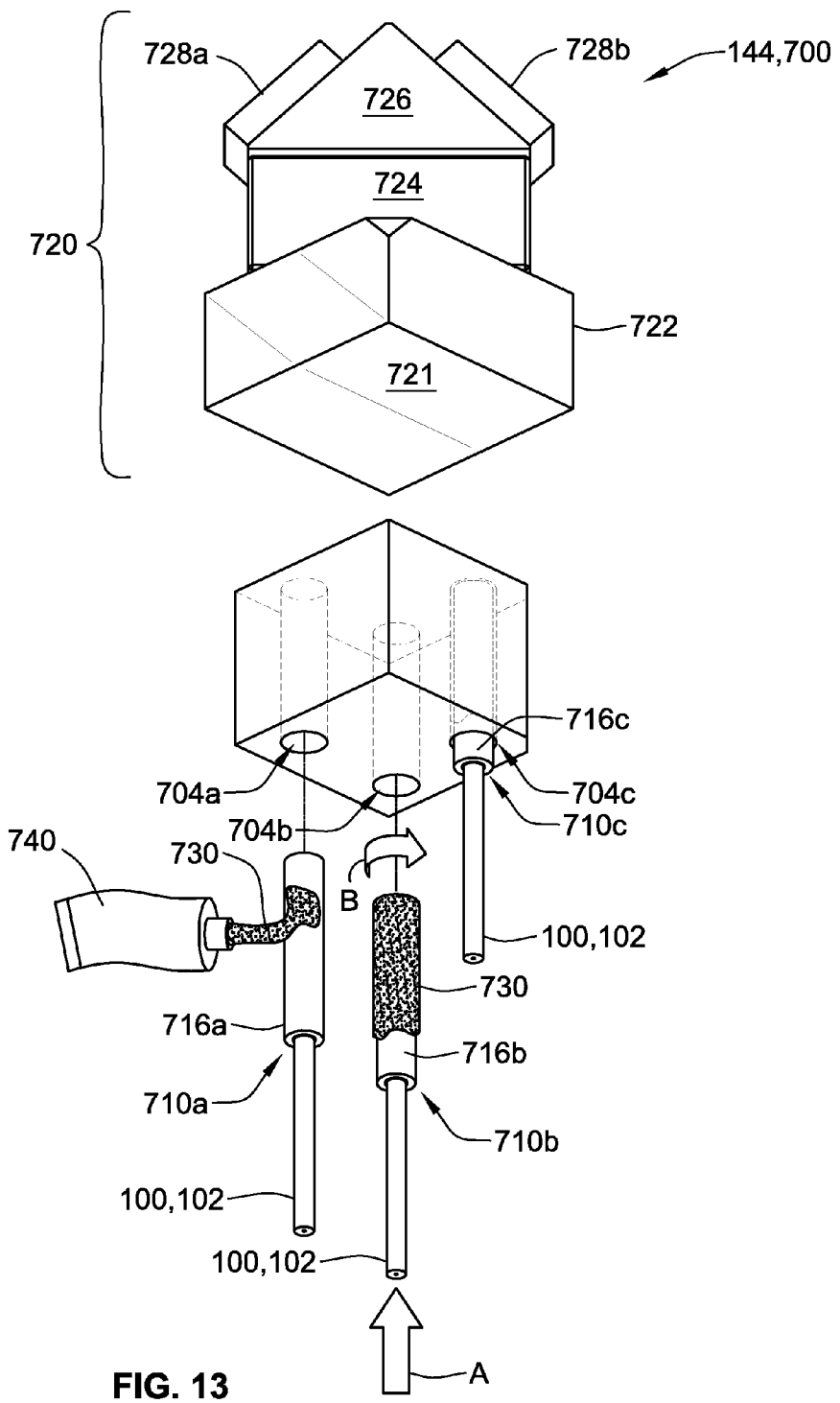
FIG. 13 is an isometric, partially exploded bottom view of the crystal assembly shown in FIG. 9 with three collimator assemblies, a first of which has been inserted into the collimator holder, a second of which has epoxy applied to its outer glass surface prior to being inserted into the collimator holder, and a third of which is about to have epoxy applied to its glass surface.
Figure 14:
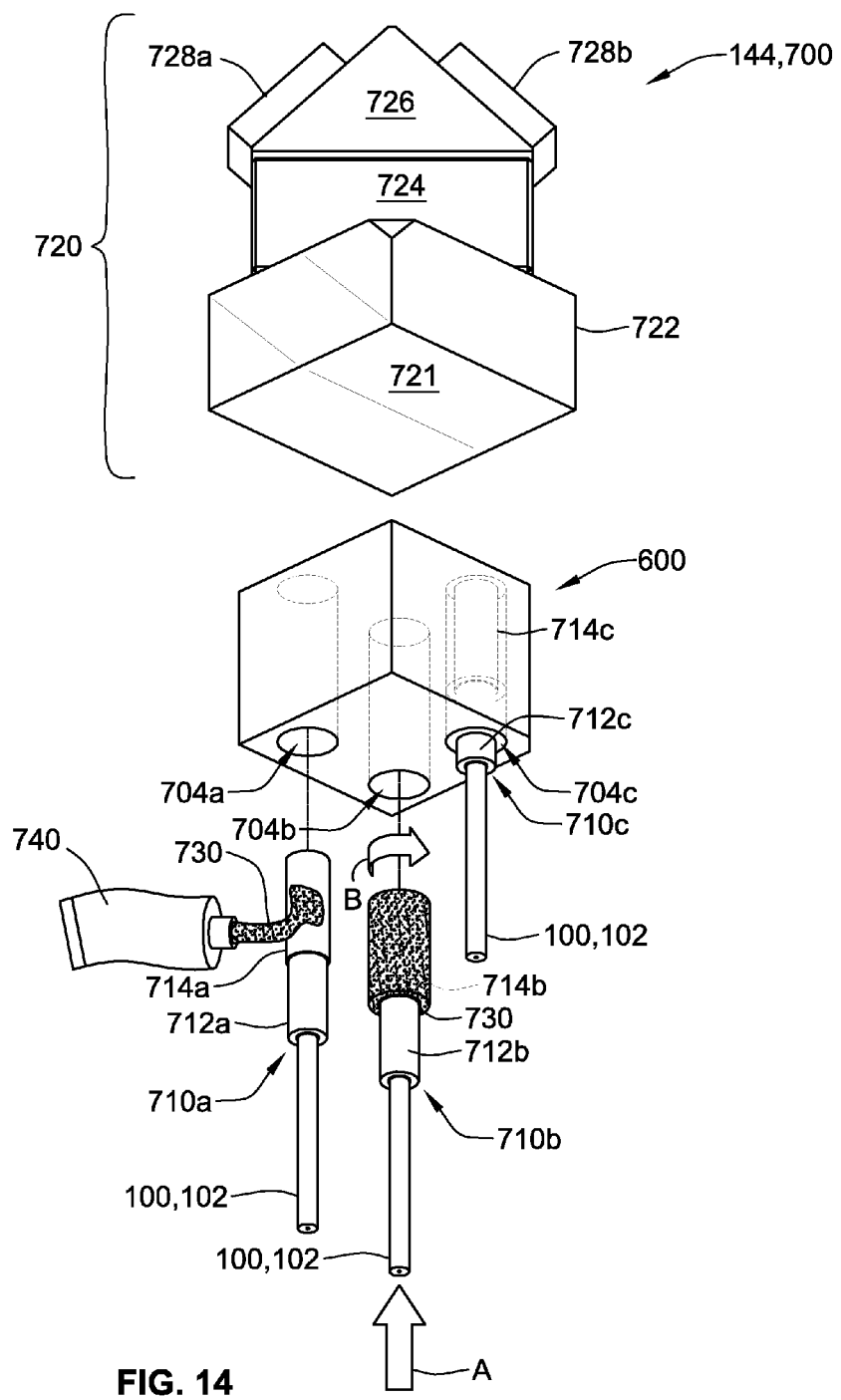
FIG. 14 is an isometric, partially exploded bottom view of the crystal assembly shown in FIG. 9 with three "tubeless" collimator assemblies in which an epoxy is applied directly to the GRIN lens of the collimator assembly before being inserted into a corresponding channel of the collimator holder.

Having described the general principles of the collimator holder 602, attention will now be turned to the different crystal assemblies to which the collimator holder 602 can be bonded, and various exemplary configurations of the electro-optical sensors in accordance with the present disclosure. First, FIGS. 7-12 illustrate an example voltage sensor 144, 700 bonded to a collimator holder, like the collimator holder 602. FIGS. 13-14 illustrate how an epoxy is applied to the collimator assemblies and then inserted into the collimator holder 602. Although these figures show the voltage sensor from FIG. 7, they apply equally to a current sensor 40, such as any of the current sensors shown in FIGS. 15-17. Reference may be made hereafter to reference numbers from FIG. 6, and this is intended to convey that the component in question can be based on the corresponding component shown and described in connection with FIG. 6 above.

FIG. 7 illustrates a top isometric view of a voltage sensor 700, which can be based on the voltage sensor 144, having two main assemblies—a crystal assembly, designated generally as 720, and a collimator holder assembly 600 that includes a collimator holder 702, which can be based on the collimator holder 602 discussed in connection with FIG. 6. The crystal assembly 720 includes a polarizing beam splitter (PBS) 722 having a bottom surface 721 (best seen in FIGS. 8 and 13) that is bonded to a top surface 708 (best seen in FIG. 9) of the collimator holder 702. The collimator holder assembly 600 includes three collimator assemblies 710a, 710b, 710c (best seen in FIG. 10), each of which includes a lens 712a, 712b, 712c, and a fiber optic ferrule 714a, 714b, 714c. In an embodiment, one or more of the collimator assemblies 710a, 710b, 710c further includes a tube 716a, 716b, 716c that surrounds at least the corresponding lens 712a, 712b, 712c. In another embodiment, one or more of the collimator assemblies 710a, 710b, 710c lack a tube 716a, 716b, 716c. The top surface 708 of the collimator holder 702 (shown in FIG. 9) has a surface area that does not exceed a surface area of the bottom surface 721 (FIG. 8) of the PBS 722.

The crystal assembly 720 includes the PBS 722, a metal-coated electro-optical crystal device 724, and a right-angle prism 726 flanked on its two angled surfaces by a pair of prism caps 728a,b. The details of the crystal assembly 720 are not germane to the present disclosure, as all aspects of the present disclosure are applicable to any electro-optical crystal assembly 720 capable of sensing a characteristic of electricity, such as current or voltage. As those skilled in the art appreciate, the metal-coating electrode on the electro-optical crystal device 724 can be composed of gold, whose purpose is to provide a constant electric field across the witness material of the electro-optical crystal. The PBS 722 can be a rhomboid polarizing beam splitter, which splits the output light into two paths, each going to a different collimator assembly, such as the collimator assemblies 710b,c. In such a case, the collimator assembly 710a is an input collimator that receives light from a light source and provides it to the crystal assembly 720. The rhomboid PBS 722 generates a linearly polarized light beam at a 45 degree angle, and traverses through the electro-optical crystal device 724 along a direction of the crystal optic axis (z-direction), and remains in the linearly polarized state at 45 degrees if no electrical field is applied between the electrode surfaces of the metal coating on the crystal device 724. The linearly polarized beam is double reflected by the right-angle prism 726, creating a 90 degree phase difference between S and P polarizations, causing the linear polarized light beam to rotate and converts into a circular polarized beam.

The circular polarized beam passes through the crystal device 724 to the output portion of the rhomboid PBS 724, with approximately half of the light intensity passing through a first output collimator assembly 710a,b,c and the other half passing through a second output collimator assembly 710c, a,b. Based on the Pockel's effect, if an electrical field is applied to the Pockel device 724, a difference in the index of refraction of the crystal material of the crystal device 724 is generated, which introduces an additional phase difference between the S and P polarization. The angle of the phase difference is linearly proportional to the applied electric field or voltage between the surfaces of the electrode on the crystal device 724. The phase-shifted polarized light outputted from the rhomboid PBS 724 travels through the output collimator assemblies to the electronics system 71, where the phase difference angle or the applied voltage is calculated.

Figure 10:
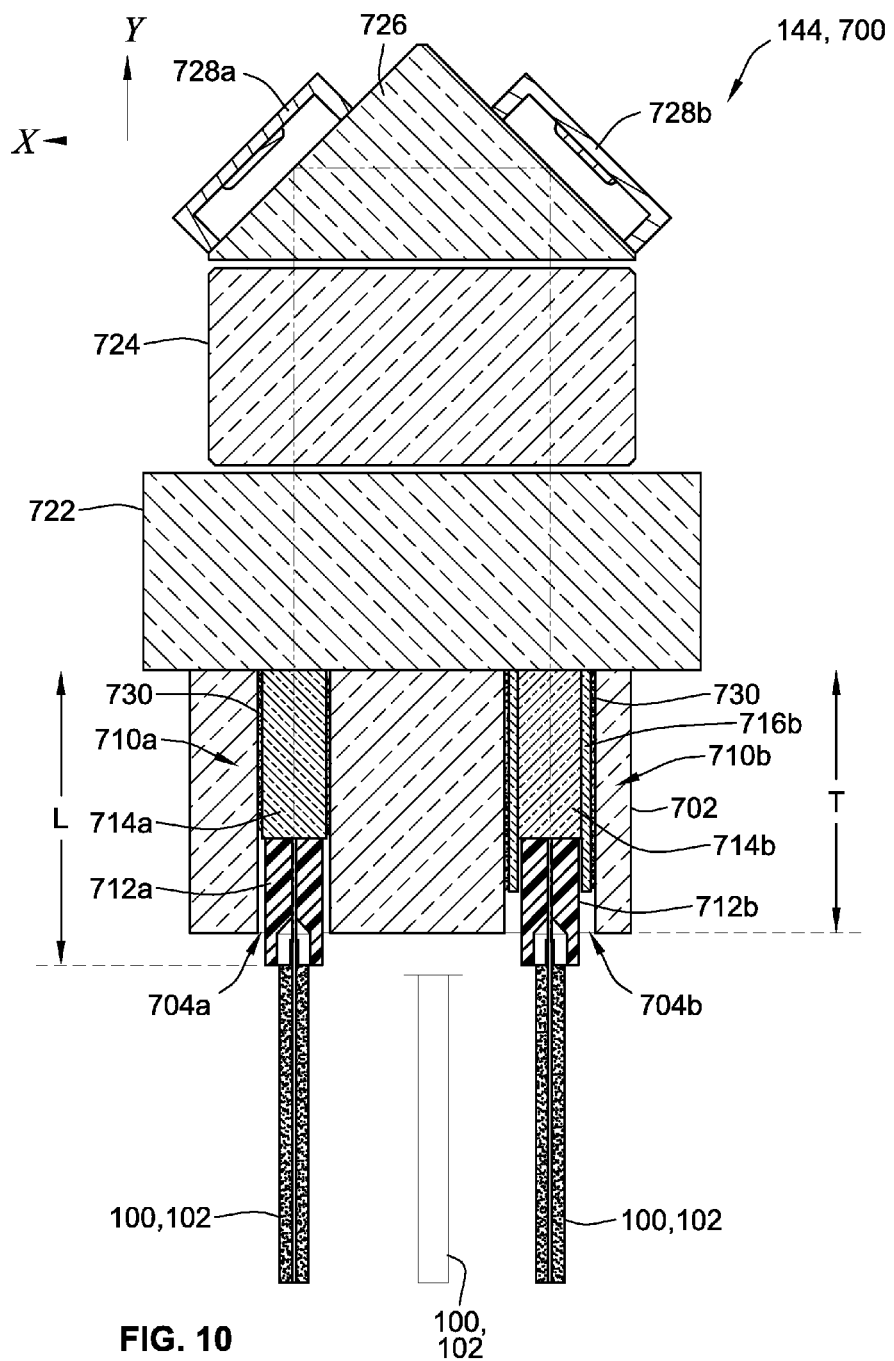
FIG. 10 is a cross-sectional view of an electro-optical voltage sensor where the crystal assembly is bonded to the collimator holder, and the collimator holder is shown accepting two different types of collimator assemblies for ease of illustration and discussion.

In FIG. 8, the ferrules 712a,b,c or the tubes 716a,b,c are shown slightly protruding out of the channels 704a,b,c of the collimator holder 702. As noted above in connection with FIG. 6, each collimator assembly 710 can include a tube 716 or lack a tube 716. All collimator assemblies 710 include at a minimum a GRIN lens 714 and a ferrule 712 that connects the optical fiber 100, 102 to the GRIN lens 714 (FIG. 10). Here, the collimator holder 702 together with the collimator assemblies 710a,b,c is bonded to the bottom surface 721 of the PBS 722 to form a complete voltage electro-optical sensor 700. One of the collimator assemblies 710a can be an input collimator, which presents an incoming light (relative to the crystal assembly 720) from a light source to the PBS 722, and the other two of the collimator assemblies 710b,c can be output collimators forming two different output channels, which carries a rotated, polarized light affected by an electric or magnetic field to the electronics system 71.

Figure 9:
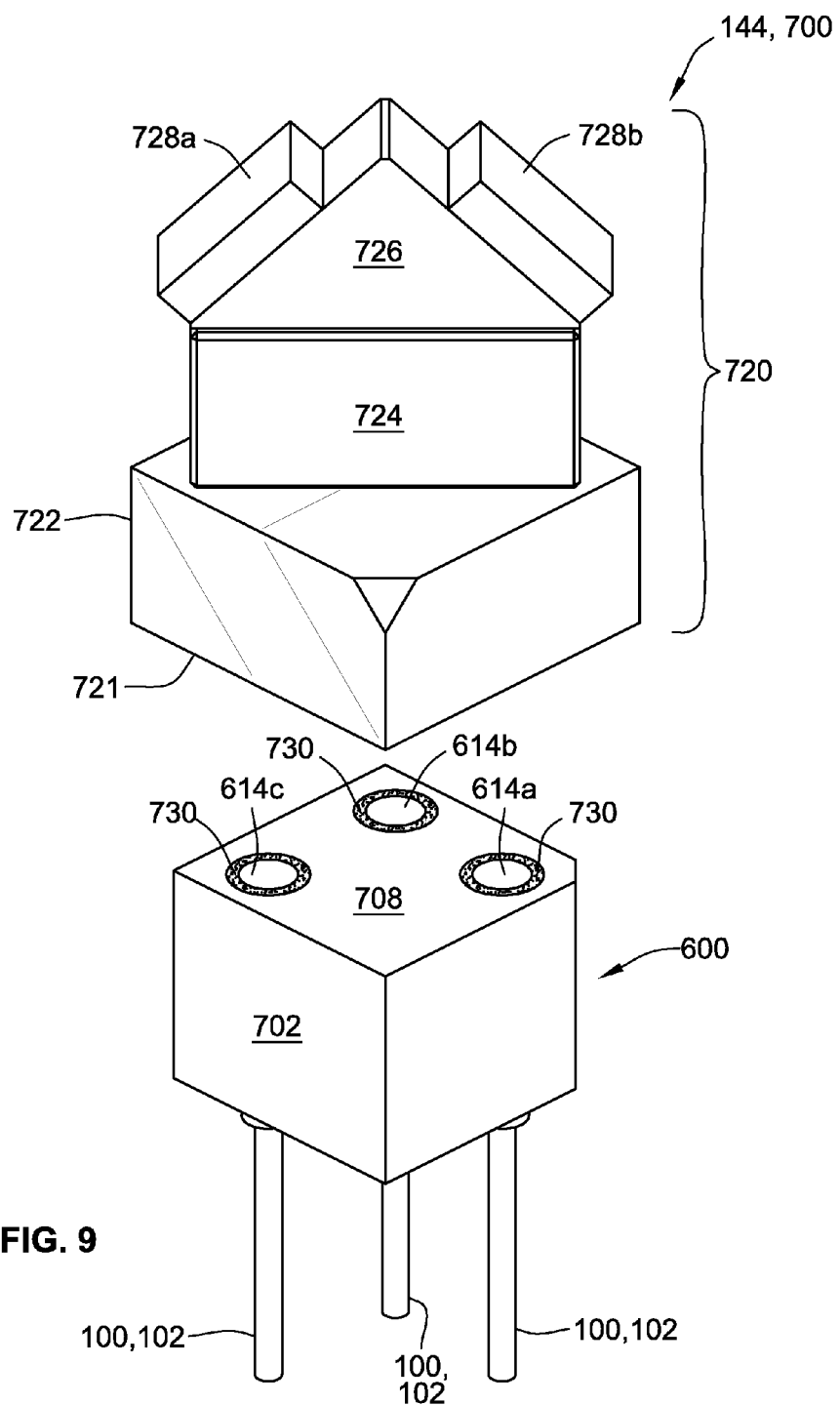
FIG. 9 is an isometric, partially exploded top view of the crystal assembly shown in FIGS. 7 and 8 about to be bonded with the collimator holder with the tops of the collimator assemblies visible from the top surface of the collimator holder.

FIG. 9 shows an exploded view of the crystal assembly 720 and the collimator holder assembly 600 partially separated from one another. In this view, the polished tops of the lenses 614a,b,c (and optionally the tubes 716a,b,c when present) of each of the collimator assemblies 710a,b,c can be seen, and these are completely flush with the polished top surface 708 of the collimator holder 702. A greatly exaggerated amount of epoxy 730 is shown for ease of illustration, and this view is not intended to be a schematic representation of the diameter of the channels 704a,b,c in the collimator holder 702 relative to the largest diameter of the lenses 714a,b,c or tubes 716a, b,c. Optionally, after the collimator assemblies 710 have been bonded inside the channels 704 of the collimator holder 702, the entire top surface 708 can be polished to create a smooth interface before bonding to the PBS 722. However, those skilled in the art will appreciate the reducing the length of the GRIN lens 714 changes its properties, so care must be taken not to polish so much that the properties of the GRIN lens 714 are materially altered from the design parameters of the electro-optical sensor 144, 700. In this example, the lenses 614a, b,c have already been polished to a desired length so that the GRIN properties are fixed, and they are inserted into the channels 704a,b,c until the tops of the lenses 614a,b,c lie flush with the top surface 708 of the collimator holder 702.

FIG. 10 is a cross-sectional view of the electro-optical sensor 144, 700 shown in FIG. 7. Here, for ease of discussion, two different types of collimator assemblies are shown to emphasize how the present disclosure encompasses both types. The collimator assembly 710a includes only the ferrule 712a attached to the optical fiber 100, 102 and the lens 714a without a tube. The collimator assembly 710b, on the other hand, includes the ferrule 712b attached to another of the optical fibers 100, 102, the lens 714b, and the tube 716b, which surrounds the lens 714b and part of the ferrule 712b. The overall length of the ferrule 712 plus the lens 714 is designed as L. By comparison, the thickness of the collimator holder 702 is designated as T, which is less than L. In this example, L is 10 mm, and T is 8 mm. Thus, the ratio between T:L can be 8:10, for example.

Figure 11:
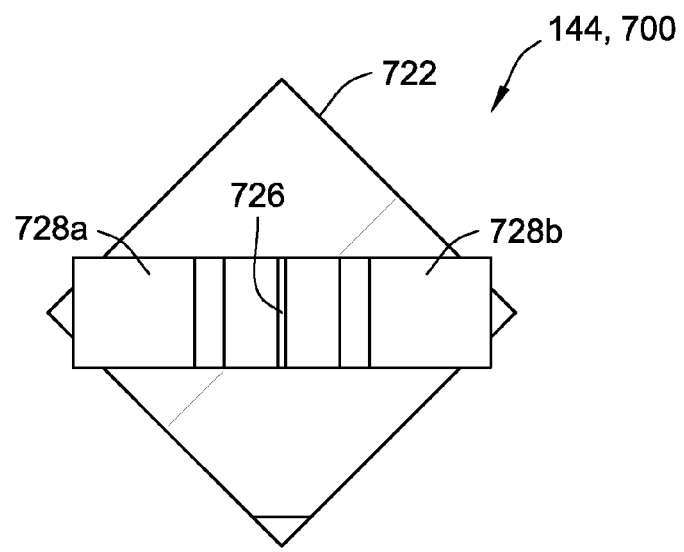
FIG. 11 is a top view of the sensor shown in FIG. 7.

FIG. 11 illustrates a top view of the voltage sensor 700 in which a top surface of the PBS 722 can be seen. FIG. 12 is a bottom view of the voltage sensor 700 shown in FIG. 11, in which the ends of the collimator assemblies 710a,b,c can be seen protruding away from the corresponding channels 704a, b,c.

FIG. 13 illustrates a method of assembling a collimator holder assembly 600, like the assembly 600 shown in FIG. 6. In this example, three collimator assemblies 710a,b,c are shown, each including a respective tube 716a,b,c. The crystal assembly 720 for the voltage sensor 700 has already been assembled as shown. An epoxy 730 is shown being applied to an outer surface of the tube 716a, whereas the epoxy 730 has already been applied on the outer surface of the tube 716b. The epoxy 730 can be applied by any suitable dispenser 740 for applying a uniform, thin coating of epoxy on the outer surfaces of the tubes 716a,b,c of the collimator assemblies 710a,b,c. A third collimator assembly 710c is shown already inserted into the channel 704c of the collimator holder 702. Once a thin, uniform layer of epoxy 730 has been applied to the tube 716b, the collimator assembly 710b is inserted into the channel 704b of the collimator holder 702 in the direction of arrow A until the top of the collimator assembly 710b is flush with the top surface 708 (see FIG. 9) of the collimator holder 702. As the collimator assembly 710*b* is being inserted, or after it has been inserted, into the channel 704*b*, the entire collimator assembly 710*b* can be rotated along the direction of arrow B (or in an opposite direction) to uniformly distribute the epoxy 730 inside the channel 704*b* to create a uniform surface tension between the tube 716*b* and the inner surface of the channel 704*b*. The channels 704*a,b,c* are machined to very tight manufacturing tolerances and have a diameter that is slightly larger than that of the tubes 716*a,b,c* or the largest diameter of the collimator assembly 710 when inserted into a channel 704. This aids in centering the collimator assemblies 710*a,b,c* within the channels 704*a,b,c*, thereby enhancing the overall accuracy of the sensor 700. By "slightly larger," it is meant that when a very thin layer of epoxy 730 is applied to the surface of the collimator assembly 710 and then the collimator assembly 710 is inserted into the channel 704, it has enough play inside the channel to be rotated until the epoxy 730 cures, whereupon a high strength bond is formed with no gaps between the epoxy and the mating surfaces.

In one example, a first collimator assembly 710*a* can be inserted into the channel 704*a*, and its orthogonality with respect to the top surface 708 of the collimator holder 702 can be precisely measured. For example, if the first collimator assembly 710*a* deviates from a precise 90 degree angle relative to the top surface 708 by 0.1 degrees, the other two collimator assemblies 710*b,c* can be rotated inside their respective channels 704*b,c* until their angle relative to 90 degrees deviates by 0.1 degrees, thereby ensuring that all of the collimator assemblies 710*a,b,c* are mutually parallel with one another, and that all three assemblies 710*a,b,c* deviate from an orthogonal orientation by the same error or offset (in this example, 0.1 degrees). In a non-limiting example, it can be desirable to align all of the collimator assemblies 710 to have a very small beam deviation angle that does not exceed 0.3 degrees. Any movement or drift over temperature or time can contribute less to measurement error if these tolerances are observed. An advantage of the collimator holder of the present disclosure is that it allows very precise alignment of the collimator assemblies relative to one another in a fixed and reliable position relative to the crystal assembly 720. Any beam deviation angle error caused by insertion of one of the collimator assemblies can be replicated in all the other collimator assemblies installed into the collimator holder 702, thereby ensuring that the collimator assemblies 710 are mutually parallel with one another.

By way of example, the epoxy 730 has a relatively low thermal expansion coefficient, high strength, and a relatively quick curing time. For example, a dual-cure epoxy can be used, in which a quick tack is formed by application of ultraviolet light to the epoxy 730, which forms a quick bond, which can be hardened and cured by thermal curing. The bonding strength of the epoxy can be stronger than the material of the collimator holder 702. For example, any force applied to separate the bond formed by the epoxy 730 would require a force sufficient to break the collimator holder 702.

Once all of the collimator assemblies 710*a,b,c* (such as two or three in this example) have been bonded into the channels 704*a,b,c* of the collimator holder 702, the top surface 708 (best seen in FIG. 9) is now ready to be bonded to the bottom surface 721 (see FIG. 14) of the PBS 722. Here, a thin, uniform layer of epoxy 730 is applied to the top surface 708 of the collimator holder 702. It is important that the layer of epoxy 730 be uniform so that the thickness of the epoxy 730 between the coplanar surfaces 708, 721 is uniform across the entire interface. This way, any expansion or contraction caused by temperature changes will cause the same lengthening or shortening of the light path between the collimator holder 702 and the crystal assembly 720. Moreover, compared to prior-art systems, the top surface 708 presents a relatively large, continuous surface area on which to apply the epoxy 730, making it easier to apply a thin, uniform layer of epoxy 730 on its surface. Any changes in the thickness of the epoxy across the surface can cause one side of interface between the holder 702 and the crystal assembly 720 to expand or contract at a different rate from another side, which can cause bending or tilting of the crystal assembly 720, and a concomitant reduction in accuracy of the sensor 700.

FIG. 14 illustrates a similar assembly process to that shown in FIG. 13, except that in FIG. 14, the collimator assemblies 710*a,b,c* lack the tube 716*a,b,c* shown in FIG. 13. For this "tubeless" collimator assembly embodiment, the epoxy 730 is applied directly to the lens 714*a,b,c* of the collimator assemblies 710*a,b,c*, which is then inserted into the channels 704*a,b,c* of the collimator holder 702 in the direction of arrow A, and rotated, such as in the direction of arrow B, until the top of the collimator assembly 710*a,b,c* is flush with the top surface 708 of the collimator holder 702. Again, as explained above, by inserting one collimator assembly 710*a*, and then measuring its offset relative to orthogonal alignment with the top surface 708, the other collimator assemblies 710*b,c* can be likewise rotated until their offset matches that of the collimator assembly 710*a*, thereby ensuring that all three collimator assemblies 710*a,b,c* are parallel and mated perpendicularly to the bottom surface 721 by the same offset angle. The epoxy 730 can also be applied to the ferrule 712*a,b,c*, which can have the same diameter or a slightly smaller diameter than a diameter of the lens 714*a,b,c*.

The assembly methods described above in connection with FIGS. 13 and 14 can be equally applied to a current sensor 40, such as any of the current sensors shown and described in connection with FIGS. 15-17, which follows next.

Figure 15:
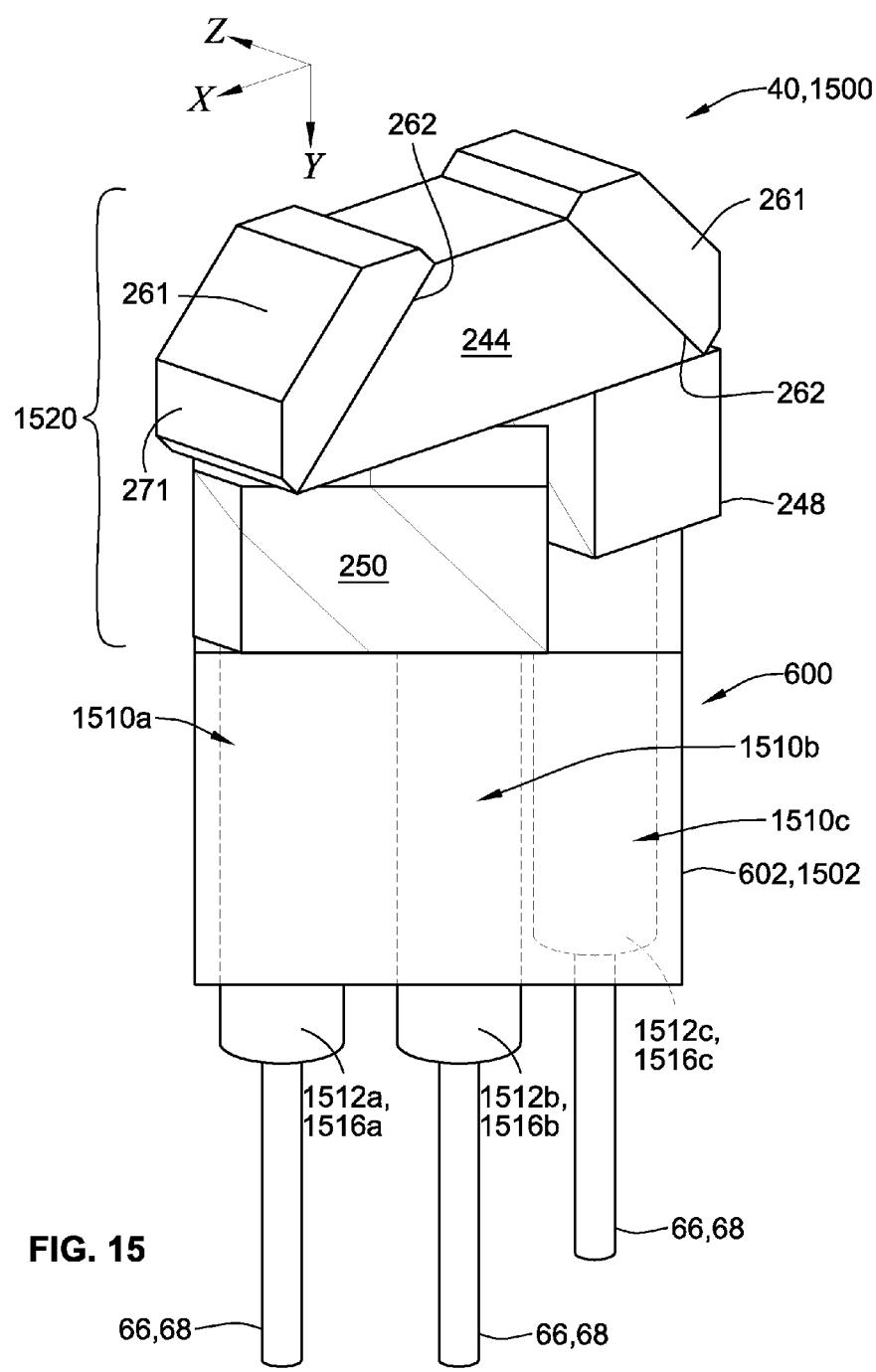
FIG. 15 is an isometric view of an electro-optical current sensor having a crystal assembly bonded to a collimator holder such as the one shown in FIG. 6.

FIG. 15 illustrates an exemplary optical sensor assembly 1500, which can be based on the current sensor 40, and is configured to sense a current flowing through the current carrying cable 12. One or more optical fibers 66, 68 extend downwards (relative to earth) along the y-axis away from the current carrying cable 12. The optical sensor assembly 1500 includes a prism 244, a pair of prism caps 261 arranged at a 45 degree angle to cover the total internal reflection (TIR) surfaces or reflective surfaces that change the direction of the polarized light by 90 degrees each time it strikes the corresponding TIR or reflective surface to cause double reflection of the polarized light. The optical sensor assembly 1500 includes an input light polarizing element 248, which is a polarizing beamsplitter (PBS) in this example, mounted directly to a bottom surface of the prism 244. The term "bottom" as used anywhere herein is not intended to reflect any particular orientation of the surface relative to earth, but rather to distinguish the various surfaces of the optical sensor assembly with different terms.

The optical sensor assembly 1500 further includes an output polarizing element 250, which in this example is a polarizing beamsplitter (PBS), which is also mounted to the prism 244.

To keep the overall length of the sensor 1500 as short as possible, the output PBS 250 is rotated at a 45 degree angle from an end edge 271 of the prism 244 and extending along a length of the prism 244. According to the Faraday effect, the rotation angle of the polarized light is a function of the Verdet constant of the material (typically glass), the magnetic flux density, and the optical path length. The rotation of the output PBS 250 relative to the prism 244 is done in such a manner so as not to increase the overall length of the sensor 240.

The output PBS 250 is a rhomboid PBS that splits the rotated, polarized light into two light beams, with approximately half of the optical intensity being received by the first optical collimator assembly 1510a and the other half of the optical intensity being received by the second optical collimator assembly 1510b.

The prism 244, and the input and output PBS 248, 250 form a crystal assembly 1520, which can be fully assembled prior to bonding the collimator holder assembly 600 to the crystal assembly 1520. Here, the collimator holder assembly 600 includes a collimator holder 1502, which can be based on the collimator holder 602, shaped to accommodate the three collimator assemblies 1510a,b,c for the current sensor 40. While the shape of the collimator holder 1502 can conveniently be block-shaped, any other suitable shape is contemplated, as long as channels can be machined into the block to correspond to the positions of the collimator assemblies 1510a,b,c for proper alignment with the input PBS 248 and the output PBS 250 of the current sensor 1500. The collimator assemblies 1510a,b,c can be of the "tubeless" type having a ferrule 1512a coupled to a lens without a tube like the tube 616. Alternately, the collimator assemblies 1510a,b,c can further include a tube 1516a,b,c surrounding the lens and optionally part or all of the ferrule 1512a,b,c. The collimator assemblies can be assembled into the collimator holder 1502 in the manner described above in connection with FIG. 13 or 14.

Figure 16:
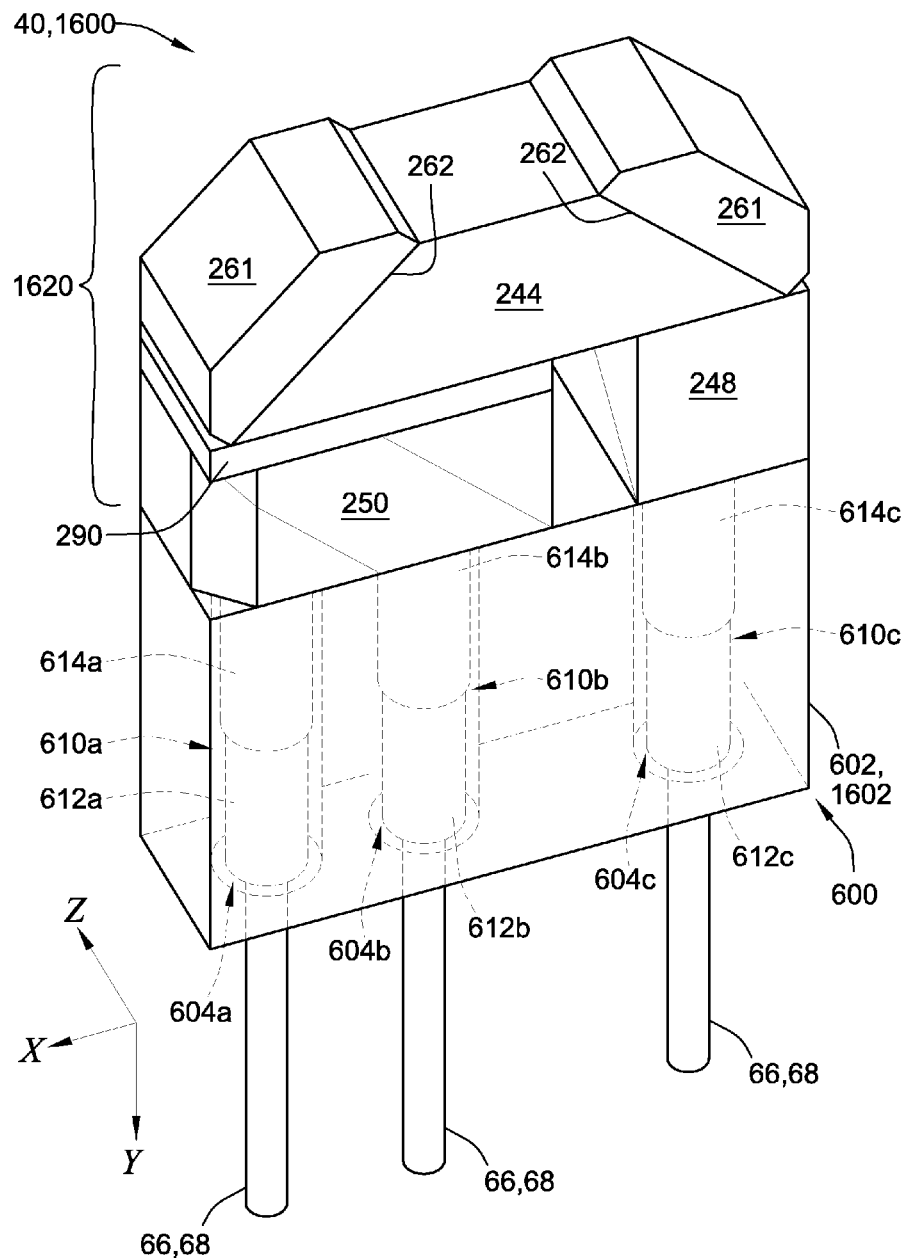
FIG. 16 is an isometric view of another example of an electro-optical current sensor having a crystal assembly bonded to a collimator holder such as the one shown in FIG. 6.
Figure 17:
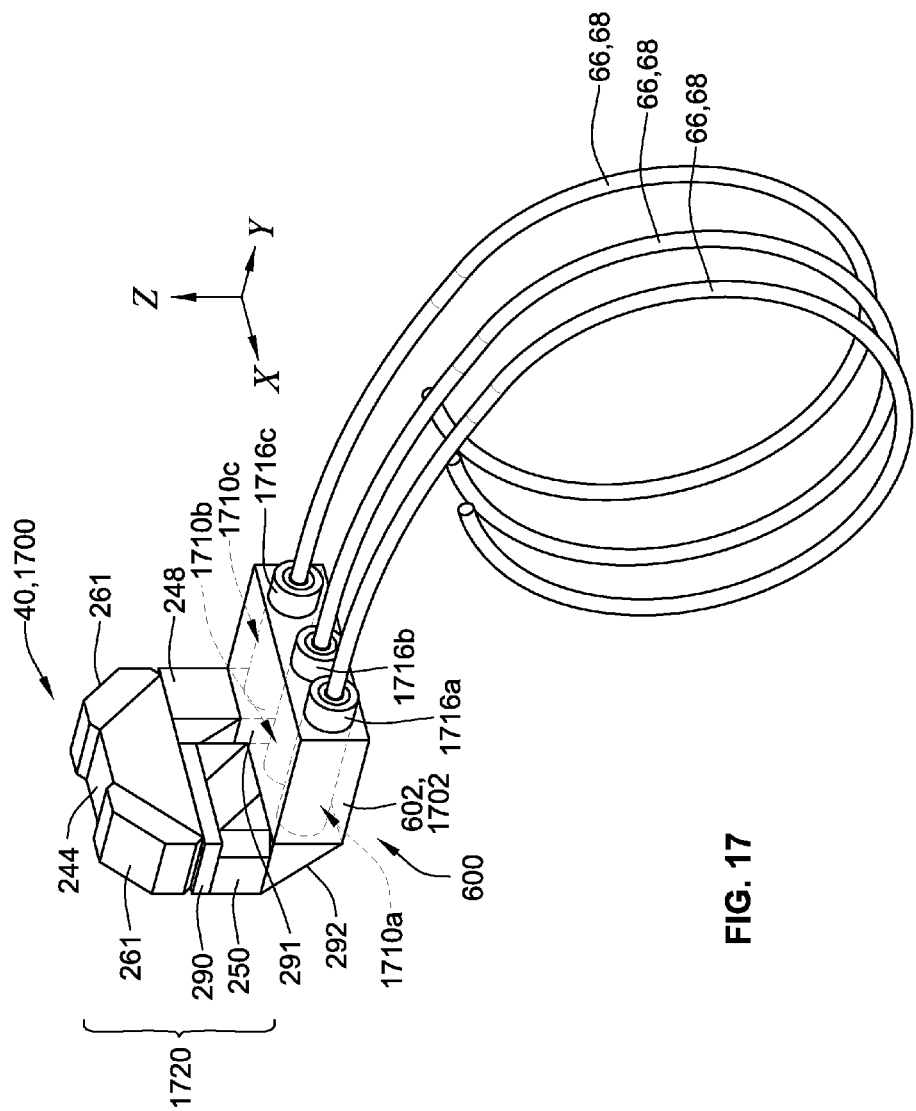
FIG. 17 is an isometric view of still another example of an electro-optical current sensor having a crystal assembly bonded to a collimator holder such as the one shown in FIG. 6.

FIG. 16 illustrates a different optical sensor assembly 1600, which can be based on the electro-optical current sensor 40, which has a more compact volume relative to the optical sensor assembly 1500 shown in FIG. 15. Here, a half-wave plate 290 is sandwiched between the prism 244 and the output PBS 250, and the output PBS 250 is aligned lengthwise with a length of the prism 244. In this example, the half-wave plate 290 is configured to rotate the light reflected off the reflective surface 262 by 45 degrees before presenting it to the output PBS 250, which splits the optical energy approximately in half, one going to each optical collimator assembly 610a,b. Now, the width of the output PBS 250 is not greater than the width of the prism 244 and the half-wave plate 290 such that the overall width of the sensor 240 when fully assembled is not increased by the output PBS 250 or the half-wave plate 290. The prism 244, input PBS 248, output PBS 250, and the half-wave plate 290 form a crystal assembly 1620, which can be fully assembled prior to the collimator holder assembly 600 being bonded thereto. The collimator holder assembly 600 as shown bonded to the crystal assembly 1620 shown in FIG. 16, helps to keep the collimator assemblies 610a,b,c mutually parallel and perpendicular to the bottom faces of the input PBS 248 and the output PBS 250 over an operational lifetime and a range of temperatures.

As discussed above, any of the optical sensor assemblies disclosed herein can be oriented along the z-axis direction (e.g., parallel to the current carrying cable 12). Thus, in FIG. 17, an example is shown of an optical sensor assembly 1700, such as based on the current sensor 40, that has the same crystal assembly 1720 as the crystal assembly 1620 shown in FIG. 16, except that a 45-degree prism mirror 292 is mounted to the output PBS 250. The prism mirror 291 is mounted to the bottom surface of the input PBS 248, which changes the direction of the incoming light beam entering the input PBS 248 along the y-axis by 90 degrees from the y-axis to the z-axis, and the prism mirror 292 is mounted to the bottom surface of the output PBS 250, which changes the direction of the rotated, polarized light exiting the output PBS 250 by 90 degrees from the z-axis direction to the y-axis direction, when the sensor assembly 1700 is installed within the airgap 60. A collimator holder assembly 600 is bonded to the 45-degree prism mirror 292, and the collimator holder assembly 600 holds the collimator assemblies 1710a,b,c in a fixed, mutually parallel position relative to one another and perpendicular to the bonding surface of the 45-degree prism mirror 292.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

While particular embodiments and applications of the present disclosure have been illustrated and described, it is to be understood that the disclosure is not limited to the precise construction and compositions disclosed herein and that various modifications, changes, and variations can be apparent from the foregoing descriptions without departing from the spirit and scope of the invention as defined in the appended claims.

What is claimed is:

1. An electro-optical sensor that senses a characteristic of electricity, comprising:
   a collimator holder having a plurality of channels formed therein;
   a crystal assembly having at least one polarizing beam-splitter (PBS) with a bottom surface bonded to atop surface of the collimator holder; and
   a plurality of collimator assemblies, each including oleos and a fiber optic ferrule housed within a tube inserted into corresponding ones of the plurality of channels, wherein a thermal expansion coefficient of the collimator holder is substantially the same as a thermal expansion coefficient of the PBS and of the tube.

2. The electro-optic sensor of claim 1, wherein the lens is a gradient-index (GRIN) lens, and each of the collimator assemblies further includes an optical fiber connected to the lens by the ferrule.

3. The electro-optic sensor of claim 1, wherein the collimator holder is composed of glass or ceramic.

4. The electro-optic sensor of claim 1, wherein the plurality of channels are parallel to each other.

5. The electro-optic sensor of claim 4, wherein each of the channels extend from one surface of the collimator holder all the way to an opposite surface of the collimator holder.

6. The electro-optic sensor of claim 5, wherein each of the collimator assemblies lie flush with the top surface of the collimator holder when fully inserted into the respective channels.

7. The electro-optic sensor of claim 1, wherein a diameter of each of the channels is slightly larger than a diameter of the tubes such that collimator assemblies are orthogonal to the bottom surface of the PBS.

8. The electro-optic sensor of claim 1, wherein a thickness of the collimator holder is at least as great as a length of the lens in the collimator assemblies.

9. The electro-optic sensor of claim 1, wherein a surface area of the top of the collimator holder is at least as great as a surface area of the bottom surface of the crystal assembly.

10. The electro-optic sensor of claim 1, wherein the tubes of the collimator assemblies are bonded to corresponding ones of the plurality of channels by a uniform layer of epoxy, and wherein the top surface of the collimator holder is bonded to the bottom surface of the crystal assembly by a uniform layer of epoxy.

11. The electro-optic sensor of claim 1, wherein the characteristic of electricity is an electrical current flowing through a current carrying cable or a voltage between the current carrying cable and another potential.

12. The electro-optic sensor of claim 1, wherein the at least one PBS includes an input PBS coupled to a first of the collimator assemblies and an output PBS coupled to at least a second of the collimator assemblies.

13. The electro-optic sensor of claim 1, wherein the plurality of channels are parallel to each other, and each of the channels extend from one surface of the collimator holder all the way to an opposite surface of the collimator holder, and wherein each of the collimator assemblies lie flush with the top surface of the collimator holder when fully inserted into the respective channels.

14. The electro-optic sensor of claim 13, wherein a diameter of each of the channels is slightly larger than a diameter of the lens such that collimator assemblies are orthogonal to the bottom surface of the PBS and centered within respective ones of the channels.

15. An electro-optical sensor that senses a characteristic of electricity, comprising:
a collimator holder having a plurality of channels formed therein;
a crystal assembly having at least one polarizing beamsplitter (PBS) with a bottom surface bonded to a top surface of the collimator holder; and
a plurality of collimator assemblies, each including a lens and a fiber optic ferrule, wherein at least the lens is inserted into corresponding ones of the plurality of channels, wherein a thermal expansion coefficient of the collimator holder is substantially the same as a thermal expansion coefficient of the PBS, and wherein a thickness of the collimator holder is between 50-100% of a length of the collimator assemblies, and wherein a surface area of the top of the collimator holder is at least as great as a surface area of the bottom surface of the crystal assembly.

16. The electro-optic sensor of claim 15, wherein the lens is a gradient-index (GRIN) lens, and each of the collimator assemblies further includes an optical fiber connected to the lens by the ferrule, and wherein a thermal expansion coefficient of the GRIN lens is substantially the same as the thermal expansion coefficient of the collimator holder.

17. The electro-optic sensor of claim 15, wherein the collimator holder is composed of glass or ceramic.

18. The electro-optic sensor of claim 15, wherein the at least one PBS includes an input PBS coupled to a first of the collimator assemblies and an output PBS coupled to at least a second of the collimator assemblies.

* * * * *